United States Patent
Kim et al.

(10) Patent No.: US 10,477,681 B2
(45) Date of Patent: Nov. 12, 2019

(54) INK COMPOSITION FOR LIGHT SINTERING, WIRING BOARD USING SAME AND MANUFACTURING METHOD THEREFOR

(71) Applicant: Korea Electronics Technology Institute, Seongnam-si, Gyeonggi-do (KR)

(72) Inventors: Yoonjin Kim, Suwon-si (KR); Jinwoo Cho, Seongnam-si (KR); Kwonwoo Shin, Hwaseong-si (KR); Yonggon Seo, Seongnam-si (KR); Yeonwon Kim, Anyang-si (KR); Sanghyeon Jang, Daejeon (KR); Namje Jo, Gyeongsangbuk-do (KR)

(73) Assignee: Korea Electronics Technology Institute, Gyeonggi-do (KR)

( * ) Notice: Subject to any disclaimer, the term of this patent is extended or adjusted under 35 U.S.C. 154(b) by 0 days.

(21) Appl. No.: 16/118,212

(22) Filed: Aug. 30, 2018

(65) Prior Publication Data

US 2018/0376593 A1  Dec. 27, 2018

Related U.S. Application Data

(62) Division of application No. 15/301,341, filed as application No. PCT/KR2015/003226 on Apr. 1, 2015, now Pat. No. 10,091,875.

(30) Foreign Application Priority Data

Apr. 1, 2014 (KR) .......................... 10-2014-0038579
Dec. 23, 2014 (KR) .......................... 10-2014-0186689
Dec. 23, 2014 (KR) .......................... 10-2014-0186691

(51) Int. Cl.
*H01B 1/20* (2006.01)
*H05K 1/00* (2006.01)
(Continued)

(52) U.S. Cl.
CPC ............ *H05K 1/095* (2013.01); *B22F 1/0022* (2013.01); *B22F 1/0074* (2013.01); *B22F 1/02* (2013.01);
(Continued)

(58) Field of Classification Search
CPC ... H01B 1/00; H01B 1/20; H01B 1/22; B05D 5/12; C04D 5/24
See application file for complete search history.

(56) References Cited

U.S. PATENT DOCUMENTS 8,999,204 B2 * 4/2015 Hong .................... C09D 11/52
                                                  252/512
9,318,243 B2    4/2016 Uchida
(Continued)

FOREIGN PATENT DOCUMENTS

JP     411310806 A  * 11/1999
JP    2012172135 A  *  9/2012
(Continued)

OTHER PUBLICATIONS

European Search Report issued in application No. 15773385.8 dated Dec. 15, 2016.
(Continued)

*Primary Examiner* — Mark Kopec
(74) *Attorney, Agent, or Firm* — Knobbe, Martens, Olson & Bear, LLP

(57) ABSTRACT

The present invention provides a method of fabricating a wiring board and a wiring board fabricated by the method, the method including a step of screen-printing the ink composition for light sintering on a flexible board body to form a preliminary wiring pattern, a step of drying the preliminary wiring pattern, and a step of reducing and sintering the oxidized copper of the copper oxide nanoparticles, which are included in the preliminary wiring pattern,
(Continued)

by irradiating the dried preliminary wiring pattern with light to form a wiring pattern on the board body.

15 Claims, 16 Drawing Sheets

(51) Int. Cl.
*C09D 5/24* (2006.01)
*H05K 1/09* (2006.01)
*B22F 9/24* (2006.01)
*C09D 11/52* (2014.01)
*H01B 1/22* (2006.01)
*B22F 1/00* (2006.01)
*B22F 1/02* (2006.01)
*C09D 11/037* (2014.01)
*H05K 3/02* (2006.01)
*H05K 3/12* (2006.01)
*H05K 3/22* (2006.01)

(52) U.S. Cl.
CPC ............ *B22F 9/24* (2013.01); *C09D 11/037* (2013.01); *C09D 11/52* (2013.01); *H01B 1/20* (2013.01); *H01B 1/22* (2013.01); *H05K 1/097* (2013.01); *H05K 3/027* (2013.01); *H05K 3/1216* (2013.01); *H05K 3/227* (2013.01); *B22F 2301/10* (2013.01); *B22F 2302/25* (2013.01); *H05K 2201/032* (2013.01)

(56) References Cited

U.S. PATENT DOCUMENTS

| | | | | |
|---|---|---|---|---|
| 10,091,875 | B2* | 10/2018 | Kim | ................ B22F 1/0074 |
| 2006/0210705 | A1 | 9/2006 | Itoh et al. | |
| 2007/0051927 | A1 | 3/2007 | Itoh et al. | |
| 2008/0087137 | A1 | 4/2008 | Shim et al. | |
| 2008/0260995 | A1* | 10/2008 | Hirakoso | ............... C09D 11/30 428/141 |
| 2010/0108366 | A1 | 5/2010 | Kim et al. | |
| 2011/0156225 | A1* | 6/2011 | Hozoji | .................. H01L 21/561 257/659 |
| 2012/0125659 | A1 | 5/2012 | Nakako et al. | |
| 2012/0251736 | A1 | 10/2012 | Hong et al. | |
| 2014/0035995 | A1 | 2/2014 | Chou et al. | |
| 2014/0333916 | A1 | 11/2014 | Bessonov | |
| 2015/0189761 | A1 | 7/2015 | Chan et al. | |
| 2016/0137855 | A1 | 5/2016 | Tsuyama et al. | |
| 2016/0155814 | A1 | 6/2016 | Ogawa et al. | |

FOREIGN PATENT DOCUMENTS

| | | |
|---|---|---|
| JP | 2013-115004 A3 | 6/2013 |
| JP | 2013-120864 A | 6/2013 |
| JP | 2013-196881 A | 9/2013 |
| KR | 10-2008-0004831 A | 1/2008 |
| KR | 10-2010-0050408 A | 5/2010 |
| KR | 10-2012-0132424 A | 12/2012 |
| KR | 10-1276237 | 6/2013 |
| KR | 10-2013-0077169 A | 7/2013 |
| KR | 10-1350507 B1 | 1/2014 |
| WO | WO 2013/077448 A1 | 5/2013 |
| WO | WO 2014/006934 A1 | 1/2014 |

OTHER PUBLICATIONS

Notice of Allowance issued in Korean application No. 10-2014-0186691 dated Dec. 30, 2016.

Office Action dated May 23, 2016 for Korean App No. 10-2014-0186691.

International Search Report dated Jun. 26, 2015 for International Application No. PCT/KR2015/003226 filed Apr. 1, 2015.

Quantum Sphere OSI-Nano Copper product data sheet. pub version Apr. 2, 2015. (Year: 2015).

Office Action received in U.S. Appl. No. 16/118,096, dated Oct. 18, 2018.

Office Action received in related U.S. Appl. No. 16/118,096, dated Feb. 14, 2019.

* cited by examiner (a) $D_{50}$ : 70nm (b) HRTEM image of (a)

(a)

(b)

(c)

INK COMPOSITION FOR LIGHT SINTERING, WIRING BOARD USING SAME AND MANUFACTURING METHOD THEREFOR

CROSS-REFERENCE TO RELATED APPLICATIONS

Any and all priority claims identified in the Application Data Sheet, or any correction thereto, are hereby incorporated by reference under 37 CFR 1.57. For example, this application is a Divisional of U.S. application Ser. No. 15/301,341, filed on Sep. 30, 2016, now U.S. Pat. No. 10,091,875 issued Oct. 2, 2018, which is a U.S. National Phase of International Application No. PCT/KR2015/003226, filed on Apr. 1, 2015 and published on Oct. 8, 2015 as WO 2015/152625. PCT/KR2015/003226 claims priority to and the benefit of Korean Patent Application No. 10-2014-0038579 filed on Apr. 1, 2014, Korean Patent Application No. 10-2014-0186689 filed on Dec. 23, 2014 and Korean Patent Application No. 10-2014-0186691 filed on Dec. 23, 2014, each of which is hereby incorporated by reference in their entireties.

BACKGROUND

Field

The present invention relates to an ink composition, a wiring board using the same, and a method of fabricating the wiring board using the ink composition, and more particularly, to an ink composition for light sintering including copper nanoparticles having copper oxide films, a wiring board using the same, and a method of fabricating the wiring board.

Description of Related Art

Conductive inks currently used in printed electronics are mainly used to form wiring patterns on wiring boards such as display panels, solar cell panels, digitizers, and printed circuit boards.

As such conductive inks, silver (Ag)-containing inks and silver pastes are mainly used. The silver-containing conductive inks may include, other than silver, metallic particles such as gold, platinum, and palladium.

The silver inks or silver pastes are formed into wiring patterns on wiring boards through a thermal sintering process. However, silver included in conductive inks is very expensive and thus, when wiring patterns are formed using the conductive inks, there is limitation in reducing fabrication costs of resultant wiring boards. In addition, since a thermal sintering process is required, there are many limitations in selecting a wiring board or an ink.

Further, when wiring patterns are formed using a silver ink or a silver paste, problems such as flaking, insufficient adhesion, and high resistance of a wiring pattern formed after thermal sintering are encountered.

RELATED ART DOCUMENT

Patent Document

Korean Patent No. 10-1276237 (registered on Jun. 12, 2013)

DISCLOSURE

Technical Problem

To address the above problems, technology for realizing a wiring pattern using a conductive ink that includes copper particles, instead of silver particles, and, accordingly, is cheap, is being developed.

However, although pure copper nanoparticles are cheap compared to silver particles, a synthesis yield of the pure copper nanoparticles is low, thus making it expensive.

In addition, when a wiring pattern is formed with a conductive ink including copper particles, a copper oxide film is easily formed on a surface of each of the copper particles included in the conductive ink and thus electric resistance of the wiring pattern greatly increases. Accordingly, the wiring pattern might not function normally.

To prevent the copper oxide film from forming on a surface of each of the copper particles, sintering should be performed at a high temperature of 300° C. or more for one to three hours under an inert gas atmosphere. However, when sintering is performed at high temperature for a long time under an inert gas atmosphere, the unit cost of production may rather increase compared to conductive inks including silver particles.

Further, when a wiring board is exposed to a high temperature of 300° C. or more, the wiring board itself may be damaged. In particular, thin and soft wiring boards, such as a flexible printed circuit board (FPCB), are vulnerable to high temperature, and thus a conductive ink including copper particles might not be used in fabricating a flexible printed circuit board.

Therefore, it is an object of the present invention to provide an ink composition for light sintering to prevent damage of a wiring board due to a sintering process by reducing a fabrication time and cost of a wiring board and the time of light irradiation, a wiring board using the same, and a method of fabricating the wiring board.

It is another object of the present invention to provide an ink composition for light sintering to form a wiring pattern without damaging a thin and soft wiring board, such as a flexible printed circuit board, a wiring board using the same, and a method of fabricating the wiring board.

It is yet another object of the present invention to provide an ink composition for light sintering to increase compactness and light sintering efficiency of a wiring pattern, a wiring board using the same, and a method of fabricating the wiring board.

SUMMARY

In accordance with an aspect of the present invention, the above and other objects can be accomplished by the provision of an ink composition for light sintering, including: copper oxide nanoparticles having copper oxide films; a reducing agent including an aldehyde-based compound for forming copper nanoparticles by reducing copper oxidized by light irradiation, an acid including ascorbic acid, a phosphorous compound, a metallic reducing agent, p-benzoquinone, hydroquinone, or anthraquinone; a dispersing agent; a binder; and a solvent.

The copper oxide nanoparticles may be formed by coating surfaces of copper nanoparticles with a copper oxide film so as to have a thickness of 500 nm or less and may have a particles size of less than 1 μm.

The dispersing agent may include an amine-based polymeric dispersing agent, a hydrocarbon-based polymeric dispersing agent having a carboxylic acid group, or a polymeric dispersing agent having a polar group.

The binder may include PVP, PVA, PVC, a cellulose-based resin, a polyvinyl chloride-based resin, a copolymerized resin, a polyvinyl alcohol-based resin, a polyvinyl pyrrolidone-based resin, an acrylic resin, a vinyl acetate-acrylic ester copolymer resin, a butyral resin, an alkyd resin, an epoxy resin, a phenolic resin, a rosin ester resin, a polyester resin, or silicone.

The solvent may include ethylene glycol (EG), diethylene glycol (DEG), dibasic ester (DBE), carbitol acetate (CA), dipropylene glycol methyl ether (DPM or DPGME), butyl carbitol acetate (BCA), butyl carbitol (BC), Texanol, terpineol, or butyl acrylate (BA).

The ink composition for light sintering according to the present invention may further include silver oxide.

A composition ratio of the silver oxide:the copper oxide nanoparticles may be 0.1:9.9 to 4:6.

The silver oxide and the copper oxide nanoparticles, except for the solvent, may be included in an amount of 70 to 94% by weight.

A powder size of the silver oxide may be 2 μm or less and the copper oxide nanoparticles may have $D_{50}$ of 900 nm or less and $D_{max}$ of 2 μm or less.

The ink composition for light sintering according to the present invention may further include pure copper particles, on exteriors of which an oxidation resistant film is formed.

A composition ratio of the pure copper particles:the copper oxide nanoparticles may be 9:1 to 1:9.

The pure copper particles may be spherical particles having $D_{50}$ of 2 μm or less or plate-shaped particles having $D_{50}$ of 4 μm or less, and the copper oxide nanoparticles may be core-shell type particles on which a copper oxide film is formed so as to have a thickness of 50 nm or less.

The pure copper particles and the copper oxide nanoparticles, except for the solvent, may be included in an amount of 70 to 94% by weight.

In accordance with another aspect of the present invention, there is provided a method of fabricating a wiring board using an ink composition for light sintering, the method including: a screen-printing step of forming a preliminary wiring pattern by screen-printing an ink composition for light sintering including copper oxide nanoparticles having copper oxide films, a reducing agent for reducing copper oxidized by light irradiation to form copper nanoparticles, a dispersing agent, a binder, and a solvent on a flexible board body; a drying step of drying the screen-printed preliminary wiring pattern; and a light sintering step of forming a wiring pattern on the board body by irradiating the dried preliminary wiring pattern with light and thus reducing and sintering the oxidized copper of the copper oxide nanoparticles included in the preliminary wiring pattern.

The fabrication method according to the present invention may further include, before the screen-printing step, a step of preparing an ink composition for light sintering by mixing copper oxide nanoparticles having copper oxide films, a reducing agent for reducing copper oxidized by light irradiation to form copper nanoparticles, a dispersing agent, a binder, and a solvent; and a step of aging a prepared ink composition for light sintering at room temperature.

In the screen-printing step, the preliminary wiring pattern may be screen-printed on the board body so as to have a wire width of 50 to 100 μm and a thickness of 5 to 10 μm In the drying step, the solvent included in the preliminary wiring pattern may be removed by applying 60 to 100° C. hot air or infrared light to the preliminary wiring pattern.

In the light sintering step, the reducing and the sintering may be performed by irradiating unicolor pulse light to the preliminary wiring pattern.

The unicolor pulse light may be white light having a pulse width of 100 μs to 1000 μs, a pulse gap of 0.01 ms to 1 ms, an output voltage of 100 to 400 V, a pulse number of 1 to 10, and an intensity of 5 J/cm$^2$ to 20 J/cm$^2$.

The unicolor pulse light may be white light generated from a xenon flash lamp.

In the light sintering step, a pulse number of the unicolor pulse light may be 1 when the thickness of the preliminary wiring pattern is less than 9 μm and a pulse number of the unicolor pulse light may be 2 or more when the thickness of the preliminary wiring pattern is 9 μm or more.

In the fabrication method according to the present invention, the ink composition for light sintering may further include silver oxide.

In the fabrication method according to the present invention, the ink composition for light sintering may further include pure copper particles, on exteriors of which an oxidation resistant film is formed.

Here, the fabrication method may further include, before the screen-printing step, a step of preparing an ink composition for light sintering by mixing pure copper particles, copper oxide nanoparticles, a reducing agent, a dispersing agent, a binder, and a solvent; and a step of aging a prepared ink composition for light sintering at room temperature.

In the screen-printing step, the preliminary wiring pattern may be screen-printed on the board body so as to have a wire width of 30 to 300 μm and a thickness of 5 to 20 μm.

In the drying step, the solvent included in the preliminary wiring pattern may be removed by applying 60 to 100° C. hot air or infrared light to the preliminary wiring pattern.

In the light sintering step, the reducing and the sintering may be performed by irradiating unicolor pulse light to the preliminary wiring pattern, wherein the unicolor pulse light may be white light having a pulse width of 100 μs to 5000 μs, an output voltage of 100 to 500 V, a pulse number of 1 to 10, and an intensity of 3 J/cm$^2$ to 60 J/cm$^2$.

In the light sintering step, a pulse number of the unicolor pulse light may be 1 when a thickness of the preliminary wiring pattern is less than 9 μm, and a pulse number of the unicolor pulse light may be 2 or more when a thickness of the preliminary wiring pattern is 9 μm or more.

In accordance with yet another aspect of the present invention, there is provided a wiring board including a board body; and a wiring pattern formed by performing light sintering after coating the ink composition for light sintering on the board body.

Certain Advantageous Effects

In accordance with the present invention, when a wiring pattern of a wiring board is formed using cheap copper nanoparticles having copper oxide films (hereinafter referred to as "copper oxide nanoparticles") as a raw material of a conductive ink, production cost of the wiring board may be reduced. That is, since a wiring pattern of a wiring board can be formed using a conductive ink including copper oxide nanoparticles, which are cheaper than pure copper nanoparticles, production cost of a wiring board may be reduced.

In addition, upon sintering after printing the conductive ink including the copper oxide nanoparticles on a wiring board, copper oxide films formed on surfaces of the copper nanoparticles may be removed by performing short-wavelength light irradiation instead of thermal sintering. Accordingly, process time may be shortened and damage of the wiring board may be prevented by a sintering process through the short-wavelength light irradiation. Here, the copper oxide nanoparticles are in an insulation state before the light sintering, but are reduced into pure copper nanoparticles by the light sintering, thereby forming a wiring pattern made of copper having electrical conductivity.

Accordingly, by applying the conductive ink according to the present invention to a board body of a flexible printed circuit board used in a digitizer, a wiring pattern may be formed without damaging the board body.

In addition, when a wiring pattern is formed on a wiring board using the conductive ink including the copper nanoparticles having copper oxide films, the wiring pattern may be formed to have a high aspect ratio by screen-printing. That is, since a signal transmission speed of a wiring board depends upon resistance, the wiring pattern may be formed to have a high aspect ratio by screen-printing.

Meanwhile, in the present invention, since a wiring pattern of a wiring board may be formed using an ink composition including pure copper particles and copper oxide nanoparticles, which are cheaper than a silver material, production cost of a wiring board may be reduced.

Since the ink composition according to the present invention includes pure copper particles, compactness of a wiring pattern may be improved compared to the case in which copper oxide nanoparticles are used alone. That is, a wiring pattern is formed in a shape wherein a plurality of pores are contained therein due to gas generated upon light sintering of an ink composition including only copper oxide nanoparticles as copper particles. On the other hand, when pure copper particles are included as in the present invention, the amount of gas generated in a light sintering process is reduced and thus the amount of pores present in the interior of a wiring pattern may be reduced, whereby a wiring pattern having increased compactness may be formed.

Since the ink composition according to the present invention includes pure copper particles, light sintering efficiency may be increased compared to the case in which copper oxide nanoparticles are used alone. That is, the ink composition including pure copper particles and copper oxide nanoparticles according to the present invention exhibits a high light absorption rate upon light sintering, compared to an ink composition including only copper oxide nanoparticles as copper particles, whereby light sintering efficiency may be increased. Accordingly, light sintering may be smoothly performed even with low intensity of light irradiation.

In addition, when a wiring pattern is formed on a wiring board using the ink composition including pure copper particles and copper oxide nanoparticles, the wiring pattern may be formed to have a high aspect ratio by screen-printing. That is, since a signal transmission speed of a wiring board depends upon resistance, a wiring pattern may be formed to have a high aspect ratio by screen-printing.

Meanwhile, since the ink composition according to the present invention includes a conductive ink including silver oxide and copper oxide nanoparticles, which are cheap compared to a silver material, to form a wiring pattern of a wiring board, production cost of a wiring board may be reduced.

In addition, when the ink composition including silver oxide and copper oxide nanoparticles is printed on a wiring board and then sintering is performed, copper oxide films formed on surfaces of the copper nanoparticles may be removed by a light sintering process using short-wavelength light irradiation instead of thermal sintering, whereby a process time may be shortened and damage of the wiring board may be prevented by the light sintering process using short-wavelength light irradiation. Here, although the copper oxide nanoparticles are in an insulation state before light sintering, the copper oxide nanoparticles are reduced to pure copper nanoparticles by light sintering, thereby forming a wiring pattern made of copper having electrical conductivity.

Since the ink composition for light sintering according to the present invention includes silver oxide, the compactness of a wiring pattern may be improved compared to the case in which copper oxide nanoparticles are used alone. That is, a wiring pattern is formed in a shape wherein a plurality of pores are contained therein due to gas generated upon light sintering of an ink composition including only copper oxide nanoparticles as copper particles. On the other hand, when silver oxide is included as in the present invention, the amount of gas generated in a light sintering process is reduced and thus the amount of pores that may present in the interior of a wiring pattern may be reduced, whereby a wiring pattern having increased compactness may be formed.

Since the ink composition for light sintering according to the present invention includes silver oxide, light sintering efficiency may be increased compared to the case in which copper oxide nanoparticles are used alone. That is, since the silver oxide included in the ink composition is brown or black, the silver oxide has a high light absorption rate and is easily decomposed and sintered upon light irradiation, and thus, light sintering efficiency may be increased. Accordingly, light sintering may be smoothly performed even with low intensity of light irradiation.

BRIEF DESCRIPTION OF THE DRAWINGS

FIG. 3 is a sectional view illustrating a wiring board,

FIG. 4 is a sectional view illustrating a step of forming a preliminary wiring pattern by screen-printing an ink composition for light sintering on a wiring board, FIG. 5 is a sectional view of illustrating a step of drying the screen-printed preliminary wiring pattern, FIG. 6 is a sectional view of illustrating a step of forming the preliminary wiring pattern to a wiring pattern by light sintering.

DETAILED DESCRIPTION

Figure 1:
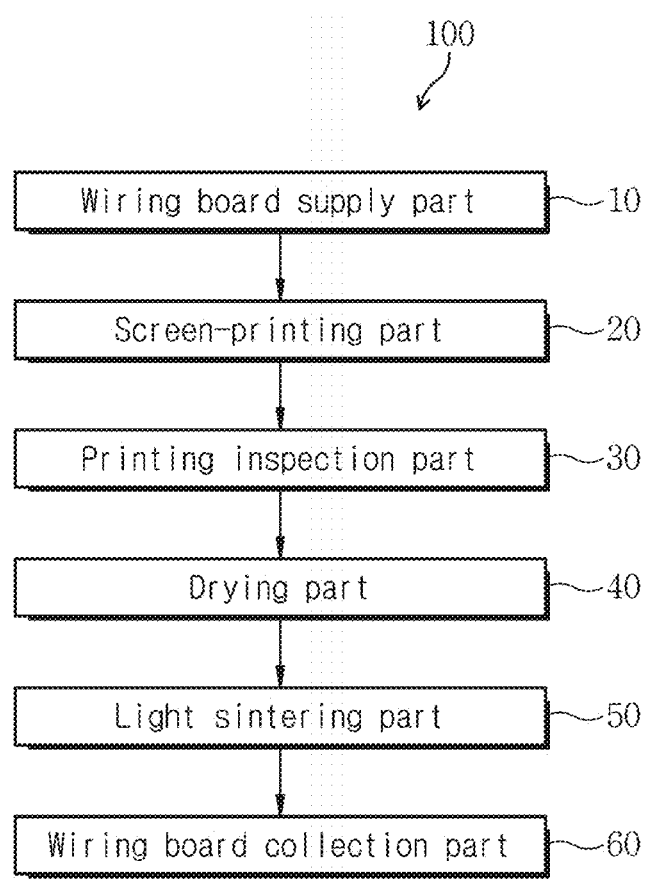
FIG. 1 is a block diagram schematically illustrating an apparatus for fabricating a wiring board using an ink composition for light sintering according to a first example of the present invention.

It should be noted that the following detailed descriptions merely provide parts necessary to understand embodiments of the present invention and the other descriptions of the present invention are omitted within a range within which the intent of the present invention is not obscured.

Terms or words used herein shall not be limited to common or dictionary meanings, and have meanings corresponding to technical aspects of the embodiments of the present invention so as to most suitably express the embodiments of the present invention. Accordingly, the constructions of examples and drawings disclosed in the present specification are merely preferred embodiments of the present invention and do not represent the full technical spirit of the present invention. Therefore, it should be understood that various equivalents and modifications may have been present at a filling time of the present application.

Hereinafter, embodiments of the present invention are described in detail with reference to the accompanying drawings First Example An ink composition for light sintering according to a first example includes copper oxide nanoparticles having copper oxide films, a reducing agent for reducing copper oxidized by light irradiation to form copper nanoparticles, a dispersing agent, a binder, and a solvent.

Although copper oxide nanoparticles are nonconductors, the copper oxide nanoparticles are converted into pure copper nanoparticles having electrical conductivity by light irradiation, thus being used as a source of a conductor. The copper oxide nanoparticles are core-shell type particles, may have a structure wherein a copper oxide film is formed so as to have a thickness of 500 nm or less on surfaces of copper nanoparticles, and may have a particles size of less than 1 µm. With regard to this, when the copper oxide film is coated so as to have a thickness of greater than 500 nm, a portion of the copper oxide film might not be reduced into copper by light irradiation. Accordingly, the copper oxide nanoparticles coated with a copper oxide film so as to have a thickness of 500 nm or less are used.

When a reducing agent is irradiated with light, the reducing agent reduces copper oxide films of copper oxide nanoparticles into copper. That is, the reducing agent converts copper oxide nanoparticles into pure copper nanoparticles. As the reducing agent, an amine-based polymeric dispersing agent, a hydrocarbon-based polymeric dispersing agent having a carboxylic acid group, or a polymeric dispersing agent having a polar group may be used.

The reducing agent may be, for example, an aldehyde-based compound such as formaldehyde or acetaldehyde, an acid such as oxalic acid, formic acid, ascorbic acid, sulfonic acid, dodecyl benzene sulfonic acid, maleic acid, hexamic acid, phosphoric acid, O-phthalic acid, or acrylic acid, a phosphorous compound such as phosphite, hypophosphite, or phosphorous acid, or a metallic reducing agent such as diisobutylaluminum hydride (DIBAL-H) or a Lindlar catalyst.

In particular, the phosphorous compound used as a reducing agent may be a phosphorous compound including an unsaturated group, for example, a hydrogenphosphonate (acid phosphite) including an $HP(O)_2OH^-$ group (such as $NH_4HP(O)_2OH$ including a $PO_3^{3-}$ group), a diphosphite including $H_2P_2O_5^{2-}$, a phosphite including $HPO_3^{2-}$, such as $(NH_4)_2HPO_3 \cdot H_2O$, $CuHPO_3 \cdot H_2O$, $SnHPO_3$, or $Al_2(HPO_3)_3 \cdot 4H_2O$, phosphite ester such as $(RO)_3P$, an organophosphorus compound, such as hypophosphite $(H_2PO_2^-)$, phosphatidylcholine, triphenylphosphate, cyclophosphamide, parathion, sarin(phosphinate), glyphosate (phosphonate), fosfomycin(phosphonate), zoledronic acid (phosphonate), or glufosinate(phosphinate), organic phosphine($PR_3$) such as triphenylphosphine, phosphine oxide($OPR_3$) such as triphenylphosphine oxide, phosphonite $(P(OR)R_2)$ such as $(CH_3O)_2PPh$, phosphonite($P(OR)_2R$), phosphinate($OP(OR)R_2$), organic phosphonates $(OP(OR)_2R)$, phosphate($PO_4^{3-}$), organophosphate($OP(OR)_3$), such as parathion, malathion, methyl parathion, chlorpyrifos, diazinon, dichlorvos, phosmet, fenitrothion, tetrachlorvinphos, azamethiphos, or azinphosmethyl, or the like.

By including the reducing agent as a catalyst of the ink composition for light sintering, sintering may be performed by light irradiation, whereby damage such as warpage or shrinkage of the wiring board may be prevented, a process time may be reduced compared to laser etching, thermal sintering etc., and process costs may be reduced.

In the ink composition for light sintering according to the first example, the reducing agent is preferably included in an amount of 0.1 to 5 parts by weight based on 100 parts by weight of the copper oxide nanoparticles. Here, when an addition amount of the reducing agent is greater than 5 parts by weight, dispersibility and compatibility of the ink composition for light sintering are reduced and thus homogeneity may be reduced. On the other hand, when an addition amount of the reducing agent is less than 0.1 parts by weight, reduction and sintering of the copper oxide nanoparticles might not be smoothly performed by unicolor light irradiation.

The dispersing agent uniformly disperses the copper oxide nanoparticles in the ink composition for light sintering, thereby preventing the generation of pores in a wiring pattern formed by light sintering.

The dispersing agent may be, without being limited to, an amine-based polymeric dispersing agent, such as polyethyleneimine or polyvinylpyrrolidone, a hydrocarbon-based polymeric dispersing agent having a carboxylic acid group, such as polyacrylic acid or carboxymethylcellulose, or a polymeric dispersing agent having a polar group, such as polyvinyl alcohol foam, a styrene-maleic acid copolymer, an olefin-maleic acid copolymer, a copolymer having polyethyleneimine and polyethyleneoxide parts in one molecule, or the like.

The binder, which serves to bind copper oxide nanoparticles when a wiring pattern is formed using the ink composition for light sintering, enables the wiring pattern to maintain superior printability and a high aspect ratio.

The binder may be, without being limited to, PVP, PVA, PVC, a cellulose-based resin, a polyvinyl chloride-based resin, a copolymerized resin, a polyvinyl alcohol-based resin, a polyvinyl pyrrolidone-based resin, an acrylic resin, a vinyl acetate-acrylic ester copolymer resin, a butyral resin, an alkyd resin, an epoxy resin, a phenolic resin, a rosin ester resin, a polyester resin, or silicone.

For example, the binder may be a mixed resin of epoxy acrylate, polyvinyl acetal, and phenolic resin. By using the mixed resin as a binder, heat curing may be performed at a temperature of about 150° C. (a three-dimensional reticular structure may be formed and thus a very thermally stable structure may be formed) and thus heat resistance of the ink composition for light sintering may be increased.

In addition, the ink composition including copper oxide nanoparticles according to the first example has a heat resistance of 280° C. or more and thus may be subjected to soldering. Accordingly, the ink composition may be soldered with a passive element, an active element, other circuit lines, etc. and thus may be electrically connected thereto. When heat resistance of the ink composition is not satisfied, resistance increases and mechanical properties are decreased at a contact or a junction, whereby defects may occur. When resistance increases, signal transmission may be delayed or various problems may occur throughout a device.

In addition, a mix ratio of epoxy acrylate, polyvinyl acetal, and a phenolic resin included in the binder is preferably 1:0.1-1:0.1-5.

An addition amount of the binder is preferably 3 to 10 parts by weight based on 100 parts by weight of the copper oxide nanoparticles. When the content of the binder is greater than 10 parts by weight, excessive increase of resistance ingredients between particles is induced and thus electrical resistance increases. When the content of the binder is less than 3 parts by weight, it is difficult to cover all particle surfaces, rheological instability is exhibited, and adhesion to a wiring board is decreased.

In addition, the solvent may be, without being limited to, a hydrocarbon-based solvent, a chlorinated hydrocarbon-based solvent, a cyclic ether-based solvent, a ketone-based solvent, an alcohol, a polyhydric alcohol-based solvent, an acetate-based solvent, an ether-based solvent or terpene-based solvent, as a polyhydric alcohol, or the like. For example, the solvent may include ethylene glycol (EG), diethylene glycol (DEG), dibasic ester (DBE), carbitol acetate (CA), dipropylene glycol methyl ether (DPM or DPGME), butyl carbitol acetate (BCA), butyl carbitol (BC), Texanol, terpineol, or butyl acrylate (BA).

The ink composition for light sintering according to the first example may be used in all of a synthetic resin board selected from polyimide, polyurethane, PMMA, and PET, a metallic board selected from stainless, aluminum, gold, and silver, or an indium tin oxide, a nonmetallic board selected from ceramic, glass, and silicone, and the like. The ink composition may increase adhesion of a wiring pattern to these boards, may increase printability of the wiring pattern, and allows realization of a high aspect ratio. In particular, the ink composition for light sintering according to the first example may be used to fabricate a wiring pattern of a thin, heat-vulnerable, and flexible wiring board.

An apparatus for fabricating a wiring board using the ink composition for light sintering according to the first example is described below with reference to FIG. 1. Here, FIG. 1 is a block diagram schematically illustrating an apparatus for fabricating a wiring board using an ink composition for light sintering according to a first example of the present invention.

Referring to FIG. 1, an apparatus 100 for fabricating the wiring board according to the first example includes a wiring board supply part 10, a screen-printing part 20, a printing inspection part 30, a drying part 40, a light-sintering part 50, and a wiring board collection part 60. Here, the wiring board supply part 10, the screen-printing part 20, the printing inspection part 30, the drying part 40, the light-sintering part 50, and the wiring board collection part 60 may be sequentially installed in a line in this order.

The wiring board supply part 10 supplies a board body used to fabricate a wiring board. Here, a wiring pattern might not be formed on both sides of the board body or may be formed on one side of the board body.

Here, the board body may be made of a plastic material having insulation performance and flexibility used to fabricate a flexible printed circuit board. For example, a material of the board body may be, without being limited to, polyimide, polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA), or cellulose acetate propionate (CAP).

The wiring board collection part 60 is installed at an opposite side of the wiring board supply part 10 and collects a board body on which a wiring pattern is completely formed.

Here, when a wiring board is a flexible printed circuit board, the wiring board supply part 10 provides a board body in a roll-to-roll manner or in a form of a unit sheet attached to a carrier frame. In the case of the roll-to-roll manner, a board body provided from a supply roll of the wiring board supply part 10 on which a board body is wound passes through the screen-printing part 20, the printing inspection part 30, the drying part 40, and the light-sintering part 50 and then may be wound and collected on a collection roll of the wiring board collection part 60.

Figure 4:
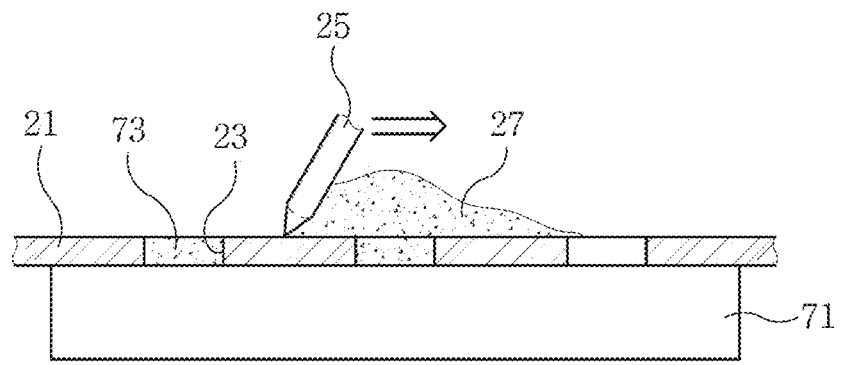

The screen-printing part 20 screen-prints a preliminary wiring pattern to be formed as a wiring pattern on the board body supplied from the wiring board supply part 10. The screen-printing part 20 may include a screen 21, in which a hole pattern 23 corresponding to a wiring pattern is formed, and a squeezer 25 for filling an ink composition for light sintering 27 into the hole pattern 23, as illustrated in FIG. 4. Although not shown, the screen-printing part 20 supports a board body 71 and includes a stage on which screen-printing is performed.

Screen-printing in the screen-printing part 20 may be performed as follows. When the board body 71 is transferred on a stage, the ink composition for light sintering 27 is injected onto the screen 21 loaded on the board body 71 by means of the squeezer 25 such that the hole pattern 23 is filled with the ink composition for light sintering 27. In addition, by separating the screen 21 from the board body 71, a preliminary wiring pattern 73 may be formed on the board body 71. For example, the preliminary wiring pattern 73 may be screen-printed on the board body 71 so as to have a wire width of 50 to 100 μm and a thickness 5 to 10 μm.

Here, the preliminary wiring pattern refers to a screen-printed wiring pattern before light sintering, and is formed as a wiring pattern by light sintering.

The printing inspection part 30 is installed near the screen-printing part 20 and inspects a preliminary wiring pattern printed on a board body discharged from the screen-printing part 20. That is, the printing inspection part 30 inspects by means of a camera whether the preliminary wiring pattern is satisfactorily printed on a board body. When no defect is investigated by the inspection, the board body may be transferred to the drying part 40. However, when defects are investigated, an alarm message is displayed or operation of the fabrication apparatus 100 of the wiring board may be temporality stopped. The alarm message may be relayed to workers through alarm sounds, alarm lights, etc.

The drying part 40 is installed near the printing inspection part 30, and dries the solvent included in the preliminary wiring pattern formed on the board body which has been validated by the printing inspection process, thereby removing the solvent. For example, the drying part 40 may dry a solvent included in the preliminary wiring pattern by providing 60 to 100° C. hot air or infrared light to the preliminary wiring pattern, thereby removing the solvent.

The light-sintering part 50 is installed near the drying part 40, and reduces and sinters oxidized copper of the copper oxide nanoparticles included in the preliminary wiring pattern by irradiating the dried preliminary wiring pattern with light, thereby forming a wiring pattern on the board body.

Here, the light-sintering part 50 may reduce and sinter the preliminary wiring pattern by irradiating unicolor pulse light to the preliminary wiring pattern, thereby forming a wiring pattern. The unicolor pulse light may be white light generated from a xenon flash lamp or pulse light or different color light generated from other lamps.

The first example uses white light generated from a xenon flash lamp, as a unicolor pulse light, because it is easy to precisely adjust pulse width, pulse gap, a pulse number, and intensity.

A unicolor pulse light used to fabricate a flexible printed circuit board may be white light having a pulse width of 100 µs to 1000 µs, a pulse gap of 0.01 ms to 1 ms, an output voltage of 100 to 400 V, a pulse number of 1 to 10, and an intensity of 5 $J/cm^2$ to 20 $J/cm^2$. For example, when the thickness of a preliminary wiring pattern is less than 9 µm, unicolor pulse light may have a pulse number of 1, and when the thickness of a preliminary wiring pattern is 9 µm or more, unicolor pulse light may have a pulse number of 2 or more.

Here, when the white light has a pulse width of greater than 1000 µs, incident energy is reduced per unit time and thus light sintering efficiency may be decreased.

When the pulse gap is greater than 1 ms or the pulse number is greater than 10, energy of white light is low and thus an ink for light sintering might not be satisfactorily sintered.

In addition, when the pulse gap is smaller than 0.01 ms or the intensity of the white light is greater than 20 $J/cm^2$, a lamp may be damaged or the lifespan of the lamp may be shortened and the flexible printed circuit board may be damaged.

In addition, when the intensity of the white light is 5 $J/cm^2$ or less, reaction for reducing the copper oxide films of the copper oxide nanoparticles to copper is weak and thus electric resistance characteristics of the wiring pattern may be deteriorated.

On the other hand, when the intensity of the white light is about 20 $J/cm^2$ or more, high energy is provided to the flexible printed circuit board and thus the board body may suffer damage such as shrinkage, warpage, distortion, etc. In addition, the wiring pattern may be exfoliated from the board body.

In addition, the wiring board on which the wiring pattern is formed by light sintering is collected in the wiring board collection part 60.

By means of the apparatus 100 for fabricating a wiring board according to the first example, a wiring pattern may be formed on an upper surface of the board body (hereinafter referred to as "upper-surface wiring pattern"), but the present invention is not limited thereto. By providing the board body, which has been collected in the wiring board collection part 60, to a second apparatus for fabricating a wiring board, which may form a wiring pattern on a lower surface of a board body, a lower-surface wiring pattern may also be formed on a lower surface of the board body. Here, the second apparatus for fabricating a wiring board may have the same structure as the apparatus 100 for fabricating a wiring board according to the first example. For example, a first apparatus for fabricating a wiring board may be connected in-line to the second apparatus for fabricating a wiring board which forms a lower wiring pattern, thereby forming the upper- and lower-surface wiring patterns on the board body.

Alternatively, a board body, an upper surface of which has an upper-surface wiring pattern by light sintering, is rewound or tilted such that a lower surface of the board body is upwardly disposed, and then the lower surface of the board body is screen-printed, dried, and light-sintered, thereby forming a lower-surface wiring pattern. That is, a board body, on both surfaces of which the upper- and lower-surface wiring patterns are formed, may be fabricated.

For example, an apparatus for fabricating a both-surfaces-patterned wiring board by tilting the wiring board may include an upper-surface wiring pattern fabrication part including a wiring board supply part for forming an upper-surface wiring pattern, a first screen printing part, a first printing inspection part, a first drying part, and a first light sintering part and a lower-surface wiring pattern fabrication part including a tilting part tilting the board body, which has passed through the first light sintering part, such that a lower surface of the board body is upwardly disposed, a second screen printing part connected to the tilting part, a second printing inspection part, a second drying part, a second light sintering part, and a wiring board collection part.

Figure 2:
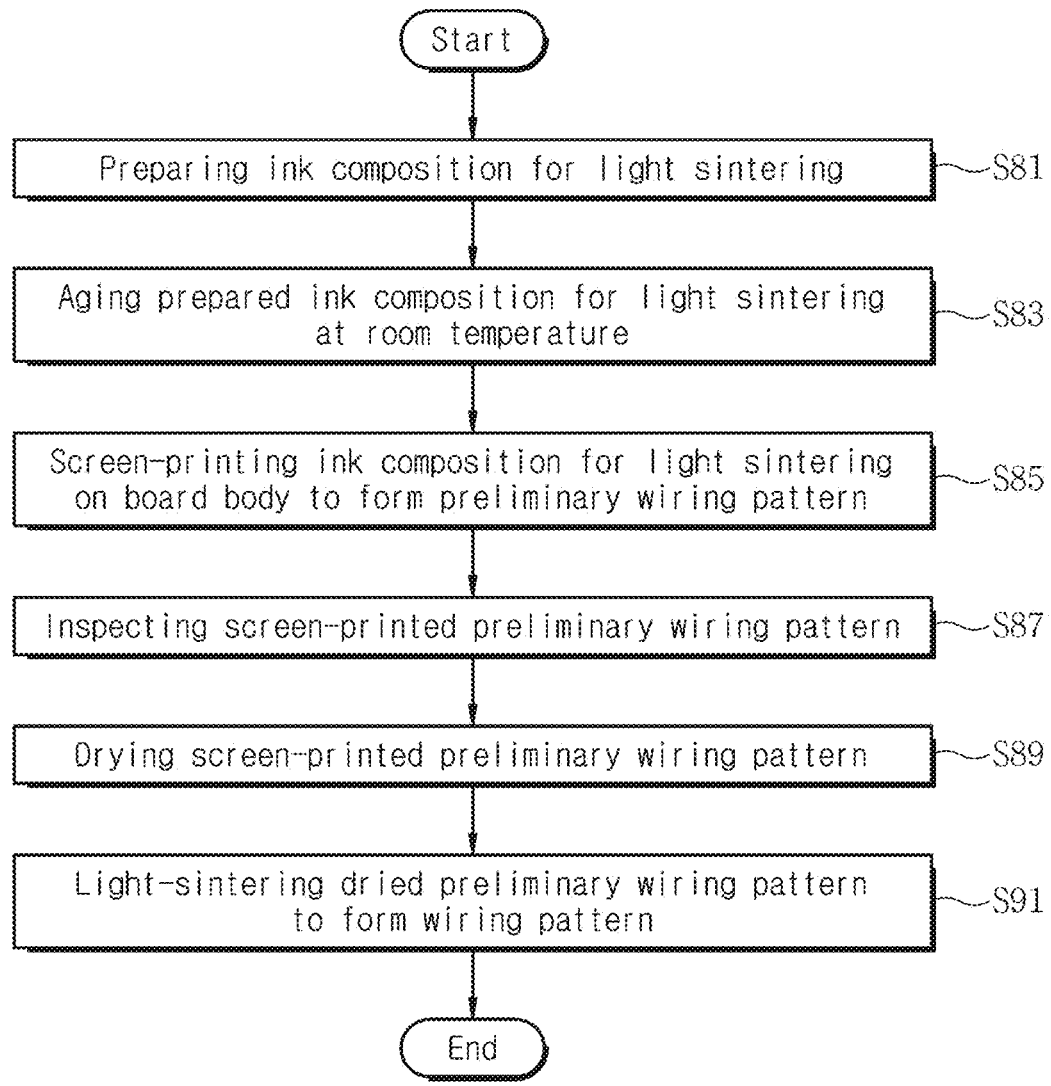
FIG. 2 is a flowchart illustrating a method of fabricating a wiring board using an ink composition for light sintering according to a first example of the present invention.

A method of fabricating a wiring board by means of such an apparatus 100 for fabricating a wiring board according to the first example is described below with reference to FIGS. 1 to 6. Here, FIG. 2 is a flowchart illustrating a method of fabricating a wiring board using an ink composition for light sintering according to the first example of the present invention. In addition, FIGS. 3 to 6 illustrate each step of the method of FIG. 2.

First, in S81, an ink composition for light sintering is prepared. That is, the ink composition for light sintering is prepared by mixing copper oxide nanoparticles, a reducing agent, a dispersing agent, a binder, and a solvent. Here, the ingredients composing the ink composition for light sintering are primarily pre-dispersed for 30 minutes to several hours by means of a pre-disperser. The pre-dispersed ink composition for light sintering is secondarily highly-dispersed by means of a 3-roll mill, whereby the ingredients composing the ink composition for light sintering may be uniformly mixed. In addition, an ink composition for light sintering to form a preliminary wiring pattern may be finally prepared by filtering foreign substances and aggregates from the mixed ink composition for light sintering.

Subsequently, in S83, the prepared ink composition for light sintering is aged at room temperature. That is, the ink composition for light sintering prepared in S81 is aged at room temperature for several hours. The aged ink composition for light sintering is provided to the screen-printing part 20.

Figure 3:
FIGS. 3 to 6 illustrate each step of the method of FIG. 2. In particular.

Subsequently, as illustrated in FIG. 3, the board body 71 is supplied to the screen-printing part 20 via the wiring board supply part 10. Here, the board body 71 may be a half-finished wiring board wherein a wiring pattern is not formed on an upper surface of the board body 71 or a wiring pattern is formed on a lower surface of the board body 71.

Subsequently, in S85, the ink composition for light sintering 27 is screen-printed on the board body 71, thereby forming the preliminary wiring pattern 73, as illustrated in FIG. 4. That is, when the board body 71 is transferred on a stage, the ink composition for light sintering 27 is injected onto the screen 21 loaded on the board body 71 by means of the squeezer 25 such that the hole pattern 23 is filled with the ink composition for light sintering 27. In addition, by separating the screen 21 from the board body 71, a preliminary wiring pattern 73 may be formed on the board body 71.

For example, the preliminary wiring pattern 73 may be screen-printed on the board body 71 so as to have a wire width of 50 to 100 μm and a thickness 5 to 10 μm. Here, when the thickness of the preliminary wiring pattern 73 is 5 μm or less, it is difficult to control a pulse of white light generated from a xenon flash lamp. Accordingly, the shape of the wiring pattern formed by the light sintering may be deformed or damaged. On the other hand, when the thickness of the preliminary wiring pattern 73 is greater than 10 μm, reduction and light sintering by light irradiation may be satisfactorily performed and thus resistance of the formed wiring pattern may increase. That is, such resistance increase occurs because a proportion of non-reduced copper oxide nanoparticles of the copper oxide nanoparticles forming the preliminary wiring pattern 73 increases proportionally to the thickness of the preliminary wiring pattern.

Subsequently, in S87, the screen-printed preliminary wiring pattern 73 is inspected. That is, the printing inspection part 30 inspects by means of a camera whether the preliminary wiring pattern 73 is satisfactorily printed on the board body 71.

Figure 5:
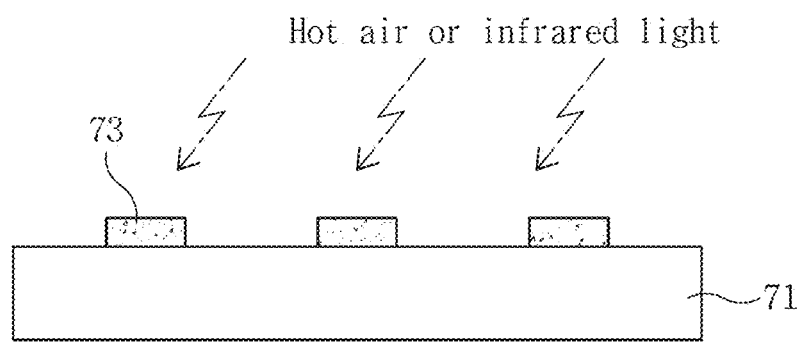

Subsequently, in S89, the screen-printed preliminary wiring pattern 73 is dried as illustrated in FIG. 5. That is, the drying part 40 dries a solvent included in the preliminary wiring pattern 73 formed on the board body 71 which has been validated by the printing inspection process, thereby removing the solvent. For example, the drying part 40 provides 60 to 100° C. hot air or infrared light to the preliminary wiring pattern 73 to dry a solvent included in the preliminary wiring pattern 73, thus removing the solvent.

Figure 6:
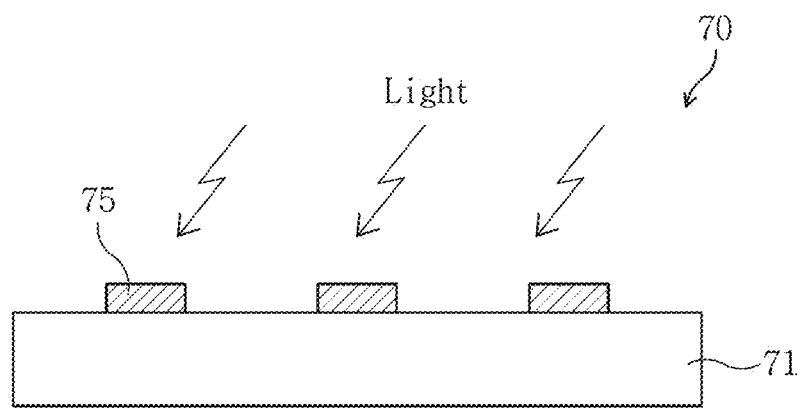

In addition, in S91, a wiring pattern 75 is formed by light-sintering the dried preliminary wiring pattern 73 and thus a wiring board 70 having the wiring pattern 75 formed thereon according to the first example may be fabricated, as illustrated in FIG. 6. That is, the light-sintering part 50 irradiates unicolor pulse light to the dried preliminary wiring pattern 73, and thus, oxidized copper of copper oxide nanoparticles included in the preliminary wiring pattern 73 is reduced and sintered, thereby forming the wiring pattern 75 on the board body 71. For example, the unicolor pulse light used to fabricate the flexible printed circuit board may be white light having a pulse width of 100 μs to 1000 μs, a pulse gap of 0.01 ms to 1 ms, an output voltage of 100 to 400 V, a pulse number of 1 to 10, and an intensity of 5 $J/cm^2$ to 20 $J/cm^2$.

Although the wiring board 70 fabricated by the method according to the first example includes the board body 71 and the wiring pattern 75 formed on an upper surface of the board body 71, the present invention is not limited to this embodiment. For example, the wiring board 70 may have a structure wherein the wiring pattern is formed on both surfaces of the board body 71. That is, when the board body 71, on a lower surface of which a lower-surface wiring pattern is formed, is provided by the wiring board supply part 10, a wiring board having a wiring pattern on both surfaces thereof may be fabricated by forming the upper-surface wiring pattern on an upper surface of the board body 71. Of course, the lower-surface wiring pattern may also be formed using the ink composition for light sintering according to the first example.

When the wiring pattern 75 of the wiring board 70 is formed using cheap copper oxide nanoparticles having a copper oxide film as a material of a conductive ink according to the first example, production cost of the wiring board 70 may be reduced. That is, since the wiring pattern 75 of the wiring board 70 may be formed using the ink composition for light sintering 27 including copper oxide nanoparticles, which are cheaper than pure copper nanoparticles, production cost of the wiring board 70 may be reduced.

In addition, since, when the ink composition for light sintering 27 including copper oxide nanoparticles is printed on the wiring board 70 and then sintered, copper oxide films formed on surfaces of the copper nanoparticles may be removed by a sintering process using short-wavelength light irradiation instead of thermal sintering, process time may be reduced and damaging of the wiring board 70 may be inhibited by the sintering process using short-wavelength light irradiation. Here, the copper oxide nanoparticles are in an insulation state before light sintering, but are reduced into pure copper nanoparticles by light sintering. Accordingly, the wiring pattern 75 composed of copper having electrical conductivity may be formed.

Accordingly, by applying the ink composition for light sintering according to the first example to a board body 71 of a flexible printed circuit board used in a digitizer, the wiring pattern 75 may be formed without damaging the board body 71.

In addition, when the wiring pattern 75 of the wiring board 70 is formed using the ink composition for light sintering including copper nanoparticles having copper oxide films, the wiring pattern 75 may be formed to have a high aspect ratio by screen-printing. That is, since a signal transmission speed of the wiring board 70 depends upon resistance, the wiring pattern 75 may be formed by screen-printing to have a high aspect ratio.

Figure 7:
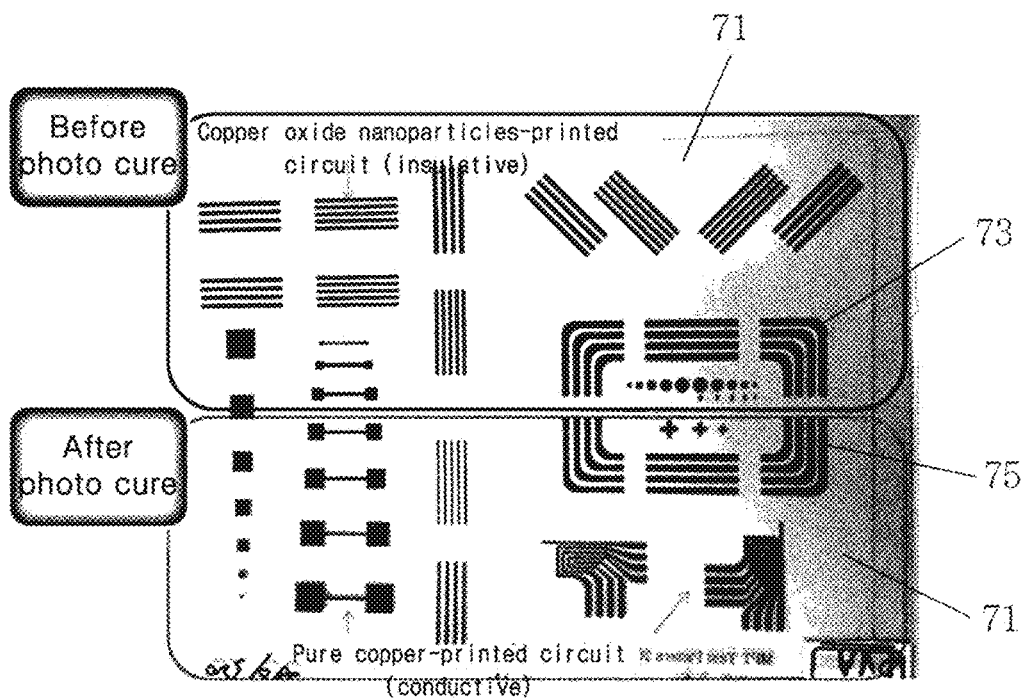
FIG. 7 illustrates photographs of a preliminary wiring pattern before light sintering and a wiring pattern after light sintering.
Figure 8:
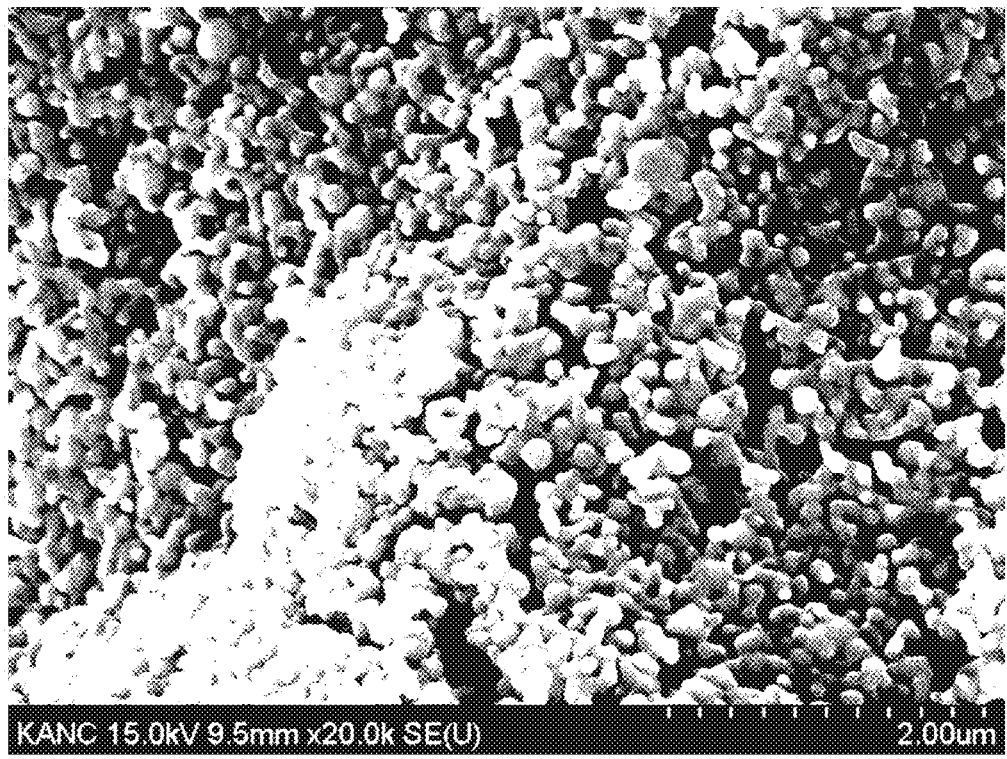
FIGS. 8 to 10 illustrate photographs of a light-sintered wiring pattern.
Figure 9:
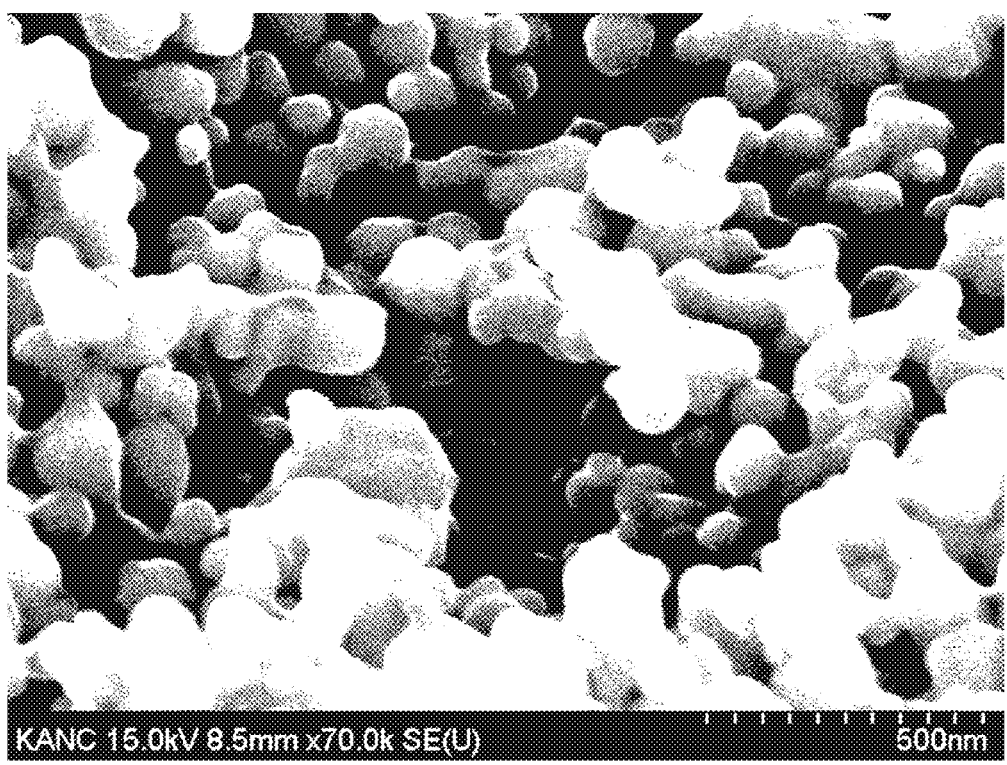
Figure 10:
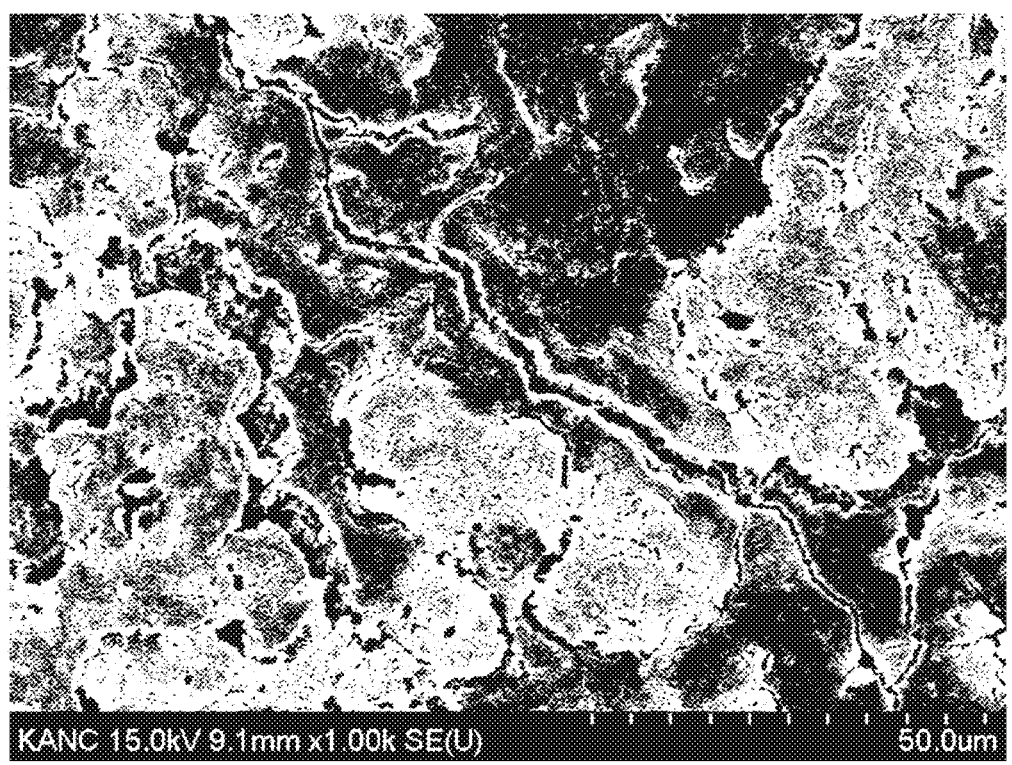

Hereinafter, the wiring board 70 fabricated by the method according to the first example is described with reference to FIGS. 7 to 10. Here, FIG. 7 illustrates photographs of a preliminary wiring pattern 73 before light sintering and a wiring pattern 75 after light sintering. In addition, FIGS. 8 to 10 illustrate photographs of a light-sintered wiring pattern. FIGS. 8 and 9 are SEM images illustrating a light-sintered wiring pattern. FIG. 10 is an SEM image illustrating a cross section of the light-sintered wiring pattern.

Here, an ink composition for light sintering according to Example 1 used to fabricate the wiring board according to the first example was prepared as follows. 120 g of copper oxide nanoparticles having a copper oxide film of a thickness of about 5 nm and a particle size of 100 nm, 0.3 g of a dispersing agent, 15 g of polyvinylpyrrolidone, and 1 g of ascorbic acid were added to 60 g of ethylene glycol and then mixed. A resultant mixture was pre-dispersed for one hour in a pre-disperser and highly-dispersed in a 3-roll mill, thereby preparing an ink composition for light sintering.

The ink composition for light sintering according to Example 1 was screen-printed on the board body 71 made of polyimide and then dried at 90° C. for 30 minutes, thereby forming the preliminary wiring pattern 73.

Subsequently, white light generated from a xenon flash lamp was irradiated to the preliminary wiring pattern 73, thereby forming the wiring pattern 75. Here, specific resistance change values of the wiring pattern 75, which was printed using white light having a pulse width of 600 µs and varying light irradiation energy to 5 to 15 J/cm$^2$, were measured. Light irradiation energy-dependent specific resistance measurement results of the wiring pattern 75 formed using the ink composition for light sintering of Example 1 are summarized in Table 1 below.

First, referring to FIG. 7, an upper part illustrates the dried preliminary wiring pattern 73 and a lower part illustrates the light-sintered wiring pattern 75. The thickness of the wiring pattern 75 is 9 µm and, before light sintering, the specific resistance of the preliminary wiring pattern 73 exhibits insulating properties. However, after light sintering, the specific resistance of the wiring pattern 75 is 4 to 6 µΩcm. That is, since the preliminary wiring pattern 73 before light sintering includes insulating copper oxide nanoparticles, the specific resistance is measured as being infinite. However, since the insulating copper oxide nanoparticles are reduced to pure copper nanoparticles by light sintering and thus sintered, the light-sintered wiring pattern 75 has a specific resistance of 4 to 6 µΩcm which indicates satisfactory electrical conductivity.

Referring to FIGS. 8 to 10, a wiring pattern composed of a pure copper material is illustrated. In particular, it can be confirmed that, as illustrated in an SEM sectional image of FIG. 10, welding occurs between particles of the wiring pattern.

TABLE 1

| Output voltage/pulse width | Irradiated light energy (J/cm$^2$) | Specific resistance (uΩcm) |
|---|---|---|
| 260/500 | 13.63 | 6 |
| 265/500 | 14.42 | 5 |
| 270/500 | 15.24 | 5 |
| 280/500 | 16.97 | 4 |

Table 1 shows output voltage, pulse width, light irradiation energy, and specific resistance upon light sintering. Here, an apparatus for light sintering used in the light-sintering part 50 to perform light irradiation was a Pulse Forge 3300 available from Novacentrics and a 4-pin probe of a LORESTA-GP was used to measure the specific resistance of a wiring pattern. Here, the thickness of a wiring pattern was 9 µm.

Referring to Table 1, an electrode specific resistance, before light sintering, of the preliminary wiring pattern fabricated by the method according to the first example exhibits insulating properties, but, after light sintering, the specific resistance of the wiring pattern is 4 to 6 µΩcm. That is, it can be confirmed that the wiring pattern fabricated by light sintering has satisfactory electrical conductivity.

Figure 11:
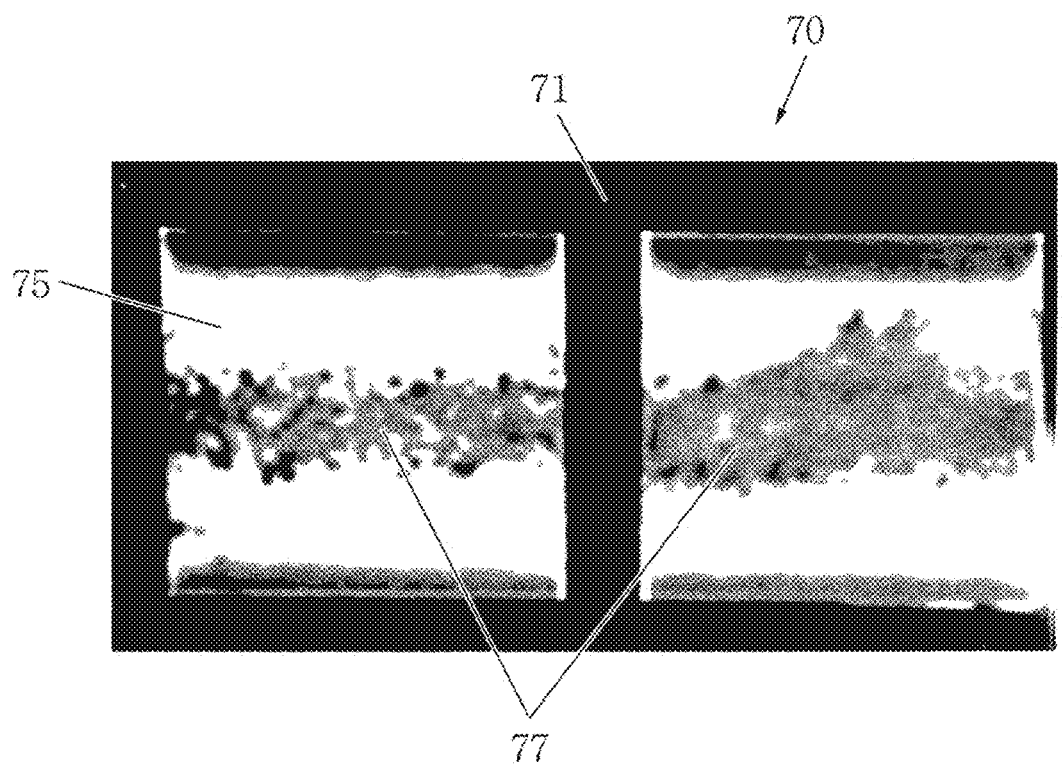
FIG. 11 is a photograph illustrating a wiring pattern sintered by an irradiated light energy of 20 $J/cm^2$.

However, it can be confirmed that, when a light irradiation energy of 20 J/cm$^2$ is irradiated to a preliminary wiring pattern upon light sintering, the wiring pattern 75 formed by light sintering is damaged as illustrated in FIG. 11. Here, FIG. 11 illustrates a photograph of the wiring pattern 75 damaged by being light-sintered at a light irradiation energy of 20 J/cm$^2$.

Referring to FIG. 11, it can be confirmed that, when the light irradiation energy is greater than 20 J/cm$^2$, most of the wiring pattern 75 is combusted and burned-out, or damages, such as board shrinkage, are caused. That is, it can be confirmed that the centers 77 of wiring patterns 75 are burned-out and detached from the board body 71.

Second Example

An ink composition for light sintering according to a second example includes silver oxide and copper oxide nanoparticles having copper oxide films and may further include a reducing agent for reducing copper oxidized by light irradiation to form copper nanoparticles, a dispersing agent, a binder, and a solvent.

The silver oxide is silver oxide (I) or silver oxide (II). Here, the silver oxide (I) is Ag$_2$O which is dark brown to blackish brown, has a specific gravity of 7.22, and is degradable at about 160° C. The silver oxide (II) is AgO which is charcoal gray, has a specific gravity of 7.483, and is degradable at about 100° C.

When xenon white light is irradiated to such silver oxide, optical absorption may be easily performed due to the color, i.e., brown or black, of the silver oxide. In addition, decomposition may be easily performed and thus sintering may be easily performed. Further, a denser wiring pattern may be fabricated. Hereinafter, a light sintering process is described in detail.

Although copper oxide nanoparticles are nonconductors, the copper oxide nanoparticles are converted into pure copper nanoparticles having electrical conductivity by light irradiation, thus being used as a source of a conductor. The copper oxide nanoparticles are core-shell type particles and a copper oxide film may be formed so as to have a thickness of 50 nm or less on surfaces thereof. With regard to this, when the copper oxide film is coated so as to have a thickness of greater than 50 nm, a portion of the copper oxide film might not be reduced into copper by light irradiation. Accordingly, the copper oxide nanoparticles coated with a copper oxide film so as to have a thickness of 50 nm or less are used. The copper oxide nanoparticles may have a D$_{50}$ of 900 nm or less and a D$_{max}$ of 2 µm or less.

A fineness number of the copper oxide nanoparticles may be selectively adjusted according to application fields. For example, upon fabrication of a metal mesh, as a substituent of an ITO transparent electrode, for touchscreens, wire should be fabricated to a width of 1 µm or less to address visibility problems, such as moire and starburst phenomena. In this case, the size of particles is preferably adjusted to 300 nm or less.

Meanwhile, in the case of a double-sided FPCB digitizer requiring a wire width of 75 µm or less, the wire width might not be 300 nm or less, and maximum-size particles may be used in a range in which light sintering is possible.

A composition ratio of the silver oxide:the copper oxide nanoparticles may be 0.1:9.9 to 4:6. With regard to a composition ratio of the silver oxide to copper oxide nanoparticles, when a ratio of the silver oxide is less than 0.1, density increase of a wiring pattern due to the silver oxide is barely exhibited and production costs are increased. On the other hand, when a ratio of the silver oxide is greater than 4, oxygen is excessively discharged and thus a porous wiring pattern may be produced.

When a reducing agent is irradiated with light, the reducing agent reduces copper oxide films of copper oxide nanoparticles into copper. That is, the reducing agent converts copper oxide nanoparticles into pure copper nanoparticles. As the reducing agent, an aldehyde-based compound, an acid including ascorbic acid, a phosphorous compound, a metallic reducing agent, p-benzoquinone, hydroquinone, or anthraquinone may be used.

For example, the aldehyde-based compound used as a reducing agent may be formaldehyde, acetaldehyde, or the like.

The acid used as a reducing agent may be oxalic acid, formic acid, ascorbic acid, sulfonic acid, dodecyl benzene sulfonic acid, maleic acid, hexamic acid, phosphoric acid, O-phthalic acid, acrylic acid, or the like.

The phosphorous compound used as a reducing agent may be a phosphite, a hypophosphite, phosphorous acid, or the like. In particular, the phosphorous compound used as a reducing agent may be a phosphorous compound including an unsaturated group, for example, a hydrogenphosphonate (acid phosphite) including an $HP(O)_2OH^-$ group (such as $NH_4HP(O)_2OH$ including a $PO_3^{3-}$ group), a diphosphite including $H_2P_2O_5^{2-}$, a phosphite including $HPO_3^{2-}$, such as $(NH_4)_2HPO_3.H_2O$, $CuHPO_3.H_2O$, $SnHPO_3$, or $Al_2(HPO_3)_3.4H_2O$, phosphite ester such as $(RO)_3P$, an organophosphorus compound, such as hypophosphite $(H_2PO_2^-)$, phosphatidylcholine, triphenylphosphate, cyclophosphamide, parathion, sarin(phosphinate), glyphosate (phosphonate), fosfomycin(phosphonate), zoledronic acid (phosphonate), or glufosinate(phosphinate), organic phosphine($PR_3$) such as triphenylphosphine, phosphine oxide($OPR_3$) such as triphenylphosphine oxide, phosphonite $(P(OR)R_2)$ such as $(CH_3O)_2PPh$, phosphonite($P(OR)_2R$), phosphinate($OP(OR)R_2$), organic phosphonates $(OP(OR)_2R)$, phosphate($PO_4^{3-}$), organophosphate $(OP(OR)_3)$, such as parathion, malathion, methyl parathion, chlorpyrifos, diazinon, dichlorvos, phosmet, fenitrothion, tetrachlorvinphos, azamethiphos, or azinphosmethyl, or the like.

The metallic reducing agent may be lithium aluminum hydride ($LiAlH_4$), diisobutylaluminum hydride (DIBAL-H), a Lindlar catalyst, or the like.

By including the reducing agent as a catalyst of the ink composition for light sintering, sintering may be performed by light irradiation, whereby damage such as warpage or shrinkage of the wiring board may be inhibited, a process time may be reduced compared to laser etching, thermal sintering, etc., and process costs may be reduced.

In the ink composition for light sintering according to the second example, the reducing agent is preferably included in an amount of 0.1 to 5 parts by weight based on 100 parts by weight of the copper oxide nanoparticles. Here, when an addition amount of the reducing agent is greater than 5 parts by weight, dispersibility and compatibility of the ink composition for light sintering are reduced and thus homogeneity may be reduced. On the other hand, when an addition amount of the reducing agent is less than 0.1 parts by weight, reduction and sintering of the copper oxide nanoparticles might not be smoothly performed by unicolor light irradiation.

The dispersing agent uniformly disperses the copper oxide nanoparticles in the ink composition for light sintering, thereby preventing the generation of pores in a wiring pattern formed by light sintering. As the dispersing agent, a cationic dispersing agent, an anionic dispersing agent, or an amphoteric ion-based dispersing agent may be used.

For example, the dispersing agent may be, without being limited to, an amine-based polymeric dispersing agent, such as polyethyleneimine or polyvinylpyrrolidone, a hydrocarbon-based polymeric dispersing agent having a carboxylic acid group, such as polyacrylic acid or carboxymethylcellulose, or a polymeric dispersing agent having a polar group, such as polyvinyl alcohol foam, a styrene-maleic acid copolymer, an olefin-maleic acid copolymer, a copolymer having polyethyleneimine and polyethyleneoxide parts in one molecule, or the like.

The binder, which serves to bind copper oxide nanoparticles when a wiring pattern is formed using the ink composition for light sintering, enables the wiring pattern to maintain superior printability and a high aspect ratio.

The binder may be, without being limited to, PVP, PVA, PVC, a cellulose-based resin, a polyvinyl chloride-based resin, a copolymerized resin, a polyvinyl alcohol-based resin, a polyvinyl pyrrolidone-based resin, an acrylic resin, a vinyl acetate-acrylic ester copolymer resin, a butyral resin, an alkyd resin, an epoxy resin, a phenolic resin, a rosin ester resin, a polyester resin, or silicone.

For example, the binder may be a mixed resin of epoxy acrylate, polyvinyl acetal, and phenolic resin. By using the mixed resin as a binder, heat curing may be performed at a temperature of about 150° C. (a three-dimensional reticular structure may be formed and thus a very thermally stable structure may be formed) and thus heat resistance of the ink composition for light sintering may be increased.

In addition, the ink composition for light sintering according to the second example has a heat resistance of 280° C. or more and thus may be subjected to soldering. Accordingly, the ink composition may be soldered with a passive element, an active element, other circuit lines, etc. and thus may be electrically connected thereto. When heat resistance of the ink composition is not satisfied, resistance increases and mechanical properties are decreased at a contact or a junction, whereby defects may occur. When resistance increases, signal transmission may be delayed or various problems may occur throughout a device.

In addition, a mix ratio of epoxy acrylate, polyvinyl acetal, and a phenolic resin included in the binder is preferably 1:0.1-1:0.1-5.

An addition amount of the binder is preferably 3 to 10 parts by weight based on 100 parts by weight of the copper oxide nanoparticles. When the content of the binder is greater than 10 parts by weight, excessive increase of resistance ingredients between particles is induced and thus electrical resistance increases. When the content of the binder is less than 3 parts by weight, it is difficult to cover all particle surfaces, rheological instability is exhibited, and adhesion to a wiring board is decreased.

In addition, the solvent may be, without being limited to, a hydrocarbon-based solvent, a chlorinated hydrocarbon-based solvent, a cyclic ether-based solvent, a ketone-based solvent, an alcohol, a polyhydric alcohol-based solvent, an acetate-based solvent, an ether-based solvent or terpene-based solvent, as a polyhydric alcohol, or the like. For example, the solvent may include ethylene glycol (EG), diethylene glycol (DEG), dibasic ester (DBE), carbitol acetate (CA), dipropylene glycol methyl ether (DPM or DPGME), butyl carbitol acetate (BCA), butyl carbitol (BC), Texanol, terpineol, or butyl acrylate (BA).

In the ink composition for light sintering according to the second example, the content of metallic particles including the copper oxide nanoparticles is preferably 70 to 94% by weight based on the content of a solid, except for a solvent. With regard to this, when the content of the metallic particles is less than 70% by weight, it is difficult to transfer current heat to all particles by light irradiation, and thus, it is difficult to fabricate a dense wiring pattern. On the other hand, when the content of the metallic particles is greater than 94% by weight, the content of the metallic particles is excessive and thus the viscosity thereof is not suitable for forming a wiring pattern. In addition, the content of the reducing agent is low with respect to the content of the particles, and thus, excessive light energy is required to perform light sintering. When the wiring board excessive is irradiated with excessive light energy, the wiring board may be damaged.

Meanwhile, the ink composition for light sintering according to the second example may additionally, selectively include an amine-based antioxidant, a thixotropic adjuster, leveling agent, a silane coupling agent for strengthening adhesion, or the like according to a use environment.

The ink composition for light sintering according to the second example may be used in all of a synthetic resin board selected from polyimide, polyurethane, PMMA, and PET, a metallic board selected from stainless, aluminum, gold, and silver, or an indium tin oxide (ITO), a nonmetallic board selected from ceramic, glass, and silicone, and the like. The ink composition may increase adhesion of a wiring pattern to these boards, may increase printability of the wiring pattern, and allows realization of a high aspect ratio. In particular, the ink composition for light sintering according to the second example may be used to fabricate a wiring pattern of a thin, heat-vulnerable, and flexible wiring board.

A wiring pattern may be formed by a screen printing, as a printing method, using the ink composition for light sintering according to the second example. However, the printing method may also be gravure printing, offset printing, flexo printing, aerosol-jet printing, slit die coating, barcoating, or the like. The ink composition for light sintering according to the second example may be applied to various printing method by changing the viscosity thereof, a solvent type, etc.

The apparatus 100 for fabricating a wiring board using the ink composition for light sintering according to the second example is the same as that illustrated in FIG. 1, except that the ink composition for light sintering according to the second example, instead of the ink composition for light sintering according to the first example, is used as an ink composition.

The second example uses white light generated from a xenon flash lamp, as a unicolor pulse light, because it is easy to precisely adjust pulse width, pulse gap, a pulse number, and intensity.

A unicolor pulse light used to fabricate a flexible printed circuit board may be white light having a pulse width of 100 μs to 1000 μs, a pulse gap of 0.01 ms to 1 ms, an output voltage of 100 to 500 V, a pulse number of 1 to 10, and an intensity of 3 J/cm$^2$ to 60 J/cm$^2$. For example, when the thickness of a preliminary wiring pattern is less than 9 μm, unicolor pulse light may have a pulse number of 1, and when the thickness of a preliminary wiring pattern is 9 μm or more, unicolor pulse light may have a pulse number of 2 or more.

Here, when the white light has a pulse width of greater than 5000 μs, incident energy is reduced per unit time and thus light sintering efficiency may be decreased.

When the pulse gap is greater than 1 ms or the pulse number is greater than 10, energy of white light is low and thus an ink composition for light sintering might not be satisfactorily sintered.

In addition, when the pulse gap is smaller than 0.01 ms or the intensity of the white light is greater than 60 J/cm$^2$, a lamp may be damaged or the lifespan of the lamp may be shortened and the flexible printed circuit board may be damaged.

In addition, when the intensity of the white light is 3 J/cm$^2$ or less, reaction for reducing the copper oxide films of the copper oxide nanoparticles to copper is weak and thus electric resistance characteristics of the wiring pattern may be deteriorated.

On the other hand, when the intensity of the white light is 60 J/cm$^2$ or more, high energy is provided to the flexible printed circuit board and thus the board body may exhibit damages such as shrinkage, warpage, distortion, etc. In addition, the wiring pattern may be exfoliated from the board body.

As such, since the ink composition for light sintering according to the second example includes the silver oxide and the copper oxide nanoparticles, a wiring pattern which is denser and has superior conductivity may be formed. In addition, since the ink composition for light sintering according to the second example is smoothly light-sintered under low light irradiation energy, production coats of a wiring board may be reduced.

Figure 12:
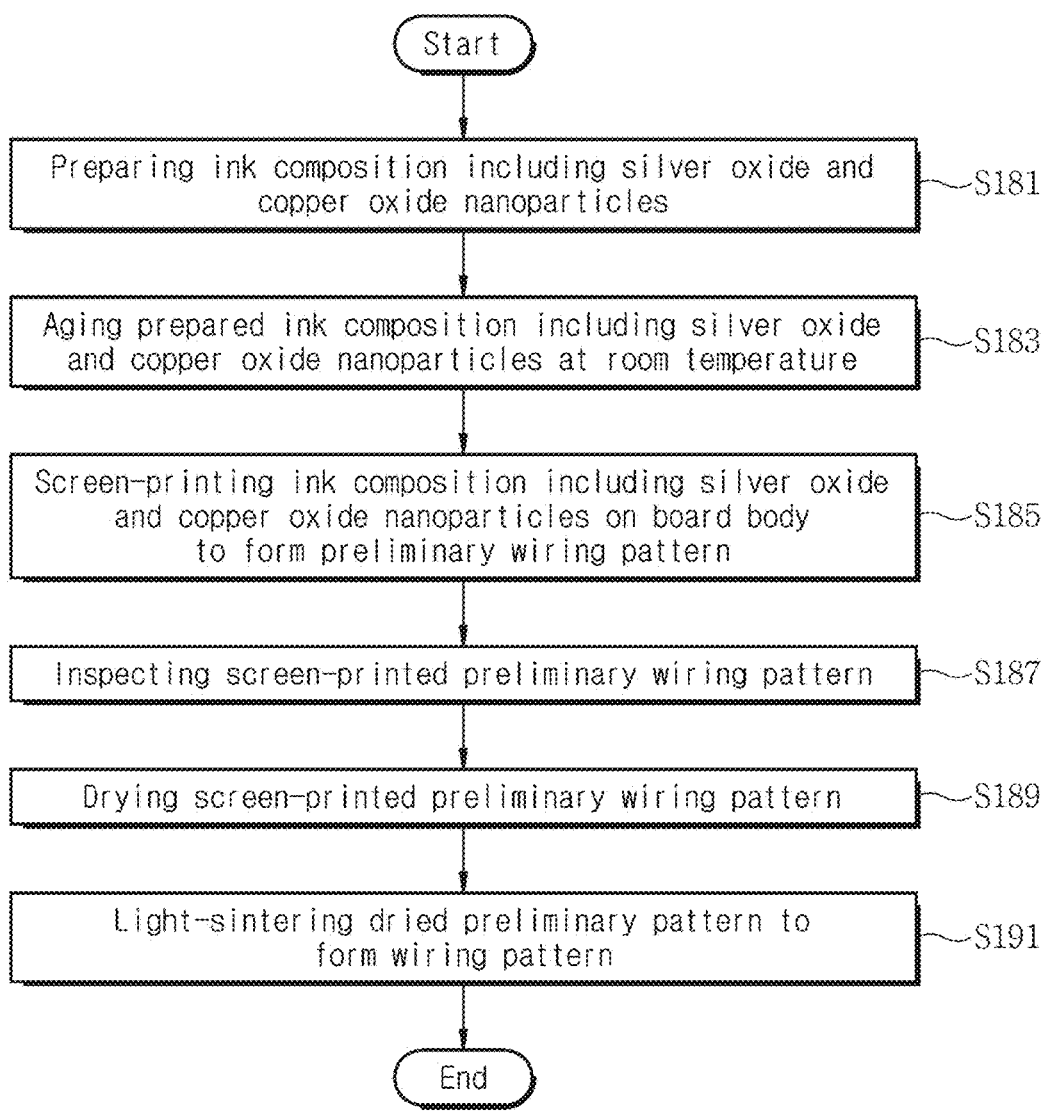
FIG. 12 illustrates a flowchart of a method of fabricating a wiring board using an ink composition for light sintering according to a second example of the present invention.

A method of fabricating a wiring board by means of such an apparatus for fabricating a wiring board is described below with reference to FIGS. 1, 3 to 7, and 12. Here, FIG. 12 is a flowchart illustrating a method of fabricating a wiring board using an ink composition for light sintering according to the second example of the present invention.

First, in S181, an ink composition for light sintering is prepared. That is, the ink composition for light sintering is prepared by mixing silver oxide, copper oxide nanoparticles, a reducing agent, a dispersing agent, a binder, and a solvent. Here, the ingredients composing the ink composition for light sintering are primarily pre-dispersed for 30 minutes to several hours by means of a pre-disperser. The pre-dispersed ink composition for light sintering is secondarily highly-dispersed by means of a 3-roll mill, whereby the ingredients composing the ink composition for light sintering may be uniformly mixed. In addition, an ink composition for light sintering to form a preliminary wiring pattern may be finally prepared by filtering foreign substances and aggregates from the mixed ink composition for light sintering.

Subsequently, in S183, the prepared ink composition for light sintering is aged at room temperature. That is, the ink composition for light sintering prepared in S81 is aged at room temperature for several hours. The aged ink composition for light sintering is provided to the screen-printing part 20.

Subsequently, as illustrated in FIG. 3, the board body 71 is supplied to the screen-printing part 20 via the wiring board supply part 10. Here, the board body 71 may be a half-finished wiring board wherein a wiring pattern is not formed on an upper surface of the board body 71 or a wiring pattern is formed on a lower surface of the board body 71.

Subsequently, in S185, the ink composition for light sintering 27 is screen-printed on the board body 71, thereby forming the preliminary wiring pattern 73, as illustrated in FIG. 4. That is, when the board body 71 is transferred on a stage, the ink composition for light sintering 27 is injected onto the screen 21 loaded on the board body 71 by means of the squeezer 25 such that the hole pattern 23 is filled with the ink composition for light sintering 27. In addition, by separating the screen 21 from the board body 71, a preliminary wiring pattern 73 may be formed on the board body 71.

For example, the preliminary wiring pattern 73 may be screen-printed on the board body 71 so as to have a wire width of 30 to 300 μm and a thickness 5 to 20 μm. Here, when the thickness of the preliminary wiring pattern 73 is 5 μm or less, it is difficult to control a pulse of white light generated from a xenon flash lamp. Accordingly, the shape of the wiring pattern formed by the light sintering may be deformed or damaged. On the other hand, when the thickness of the preliminary wiring pattern 73 is greater than 20 µm, reduction and light sintering by light irradiation may be satisfactorily performed and thus resistance of the formed wiring pattern may increase. That is, such resistance increase occurs because a proportion of non-reduced copper oxide nanoparticles of the copper oxide nanoparticles forming the preliminary wiring pattern 73 increases proportionally to the thickness of the preliminary wiring pattern.

Subsequently, in S187, the screen-printed preliminary wiring pattern 73 is inspected. That is, the printing inspection part 30 inspects by means of a camera whether the preliminary wiring pattern 73 is satisfactorily printed on the board body 71.

Subsequently, in S189, the screen-printed preliminary wiring pattern 73 is dried as illustrated in FIG. 5. That is, the drying part 40 dries a solvent included in the preliminary wiring pattern 73 formed on the board body 71 which has been validated by the printing inspection process, thereby removing the solvent. For example, the drying part 40 provides 60 to 100° C. hot air or infrared light to the preliminary wiring pattern 73 to dry a solvent included in the preliminary wiring pattern 73, thus removing the solvent.

In addition, in S191, a wiring pattern 75 is formed by light-sintering the dried preliminary wiring pattern 73 and thus a wiring board 70 having the wiring pattern 75 formed thereon according to the second example may be fabricated, as illustrated in FIG. 6. That is, the light-sintering part 50 irradiates unicolor pulse light to the dried preliminary wiring pattern 73, and thus, oxidized copper of copper oxide nanoparticles included in the preliminary wiring pattern 73 is reduced and sintered, thereby forming the wiring pattern 75 on the board body 71. For example, the unicolor pulse light used to fabricate the flexible printed circuit board may be white light having a pulse width of 100 µs to 5000 µs, a pulse gap of 0.01 ms to 1 ms, an output voltage of 100 to 500 V, a pulse number of 1 to 10, and an intensity of 3 J/cm$^2$ to 60 J/cm$^2$.

Although the wiring board 70 fabricated by the method according to the second example includes the board body 71 and the wiring pattern 75 formed on an upper surface of the board body 71, the present invention is not limited to this embodiment. For example, the wiring board 70 may have a structure wherein the wiring pattern is formed on both surfaces of the board body 71. That is, when the board body 71, on a lower surface of which a lower-surface wiring pattern is formed, is provided by the wiring board supply part 10, a wiring board having a wiring pattern on both surfaces thereof may be fabricated by forming the upper-surface wiring pattern on an upper surface of the board body 71. Of course, the lower-surface wiring pattern may also be formed using the ink composition for light sintering according to the second example.

When the wiring pattern 75 of the wiring board 70 is formed using cheap copper oxide nanoparticles having a copper oxide film as a material of the ink composition for light sintering according to the second example, production cost of the wiring board 70 may be reduced.

In addition, since, when the ink composition for light sintering 27 including silver oxide and copper oxide nanoparticles is printed on the wiring board 70 and then sintered, copper oxide films formed on surfaces of the copper nanoparticles may be removed by a sintering process using short-wavelength light irradiation instead of thermal sintering, process time may be reduced and damaging of the wiring board 70 may be inhibited by the sintering process using short-wavelength light irradiation. Here, the copper oxide nanoparticles are in an insulation state before light sintering, but are reduced into pure copper nanoparticles by light sintering. Accordingly, the wiring pattern 75 composed of copper having electrical conductivity may be formed.

Accordingly, by applying the ink composition for light sintering according to the second example to a board body 71 of a flexible printed circuit board used in a digitizer, the wiring pattern 75 may be formed without damaging the board body 71.

In addition, when the wiring pattern 75 of the wiring board 70 is formed using the ink composition for light sintering including copper nanoparticles having copper oxide films, the wiring pattern 75 may be formed to have a high aspect ratio by screen-printing. That is, since a signal transmission speed of the wiring board 70 depends upon resistance, the wiring pattern 75 may be formed by screen-printing to have a high aspect ratio.

In addition, since the ink composition for light sintering according to the second example includes silver oxide, compactness of a wiring pattern may be increased compared to the case in which copper oxide nanoparticles are used alone. That is, an ink composition including only copper oxide nanoparticles forms a wiring pattern in a shape wherein a plurality of pores are included in the interior of the wiring pattern due to gas generated upon light sintering. However, when silver oxide is included as in the second example, the amount of gas generated in a light sintering process is reduced and thus the amount of pores that may present in the interior of the wiring pattern may be reduced, thereby forming a wiring pattern having improved compactness.

Since the ink composition for light sintering according to the second example includes silver oxide, light sintering efficiency may be increased compared to the case in which copper oxide nanoparticles are used alone. That is, upon light sintering of the ink composition including silver oxide as in the second example, a light absorption rate is high and thus light sintering efficiency may be increased, compared to an ink composition including only copper oxide nanoparticles as copper particles.

To investigate the characteristics of the wiring board fabricated according to the method of the first example, a wiring board was fabricated using an ink composition according to each of examples and comparative examples as summarized the following table.

TABLE 2

| Sample | Application voltage (V) | Pulse width | Specific light energy (J/cm$^2$) | Specific resistance (×10$^{-6}$ Ωcm) | Density before sintering (g/cm$^2$) | Density after sintering (g/cm$^2$) |
|---|---|---|---|---|---|---|
| Example 1 | 390 | 1500/500/200 | 38 | 2.7 | 4.1 | 8.9 |
| Example 2 | 370 | 2200 | 27 | 2.5 | 3.8 | 9.1 |

TABLE 2-continued

| Sample | Application voltage (V) | Pulse width | Specific light energy (J/cm$^2$) | Specific resistance (×10$^{-6}$ Ωcm) | Density before sintering (g/cm$^2$) | Density after sintering (g/cm$^2$) |
|---|---|---|---|---|---|---|
| Comparative Example 1 | 370 | 1500/500/200 | 38 | 4.7 | 4.2 | 8.2 |
| Comparative Example 2 | 370 | 2200 | 27 | 5.3 | 4.2 | 8.0 |

Table 2 shows light irradiation energy and specific resistance upon light sintering according to examples and comparative examples. As a light sintering apparatus for light irradiation, Pulse forge 1300 available from Novacentrics was used and specific resistance was measured by means of a 4-pin probe of LORESTA-GP.

Example 1

An ink composition for light sintering including 80% by weight of metallic particles in which silver oxide and copper oxide nanoparticles, which were coated with a copper oxide film so as to have a thickness of about 30 nm and had a $D_{50}$ of 100 nm, are mixed, was prepared. Here, a composition ratio of the silver oxide to the copper oxide nanoparticles is 2:8.

A 2×2 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 2.

In addition, to calculate the density of a printed electrode after drying, the weight of the printed electrode was measured and the thickness of the electrode was measured by means of a confocal microscope.

As a result, the density was determined to be about 4.1 g/cm$^3$. After light sintering, the density increased to 8.9 g/cm$^3$ and a specific resistance was 2.7×10$^{-6}$ Ωcm.

Example 2

An ink composition for light sintering including 80% by weight of metallic particles in which silver oxide and copper oxide nanoparticles, which were coated with a copper oxide film so as to have a thickness of about 30 nm and had a $D_{50}$ of 100 nm, are mixed, was prepared. Here, a composition ratio of the silver oxide to the copper oxide nanoparticles is 3:7.

A 2×2 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 2.

In addition, to calculate the density of a printed electrode after drying, the weight of the printed electrode was weighed and the thickness of the electrode was measured by means of a confocal microscope.

As a result, the density was determined to be about 3.8 g/cm$^3$. After light sintering, the density increased to 9.1 g/cm$^3$ and a specific resistance was 2.5×10$^{-6}$ Ωcm.

Comparative Example 1

An ink composition including 80% by weight of metallic particles that were merely composed of copper oxide nanoparticles coated with a copper oxide film so as to have a thickness of about 30 nm and having a $D_{50}$ of 100 nm was prepared.

A 2×2 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 2. Here, a light irradiation condition was the same as that of Example 1.

In addition, to calculate the density of a printed electrode after drying, the weight of the printed electrode was weighed and the thickness of the electrode was measured by means of a confocal microscope.

As a result, the density was determined to be about 4.2 g/cm$^3$. After light sintering, the density increased to 8.2 g/cm$^3$ and a specific resistance was 4.7×10$^{-6}$ Ωcm.

Comparative Example 2

An ink composition including 80% by weight of metallic particles that were merely composed of copper oxide nanoparticles coated with a copper oxide film so as to have a thickness of about 30 nm and having a $D_{50}$ of 100 nm was prepared.

A 2×2 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 2. Here, a light irradiation condition was the same as that of Example 2.

In addition, to calculate the density of a printed electrode after drying, the weight of the printed electrode was weighed and the thickness of the electrode was measured by means of a confocal microscope.

As a result, the density was determined to be about 4.2 g/cm$^3$. After light sintering, the density increased to 8.0 g/cm$^3$ and a specific resistance was 5.3×10$^{-6}$ Ωcm.

As such, it can be confirmed that the patterns formed using the ink compositions for light sintering according to Examples 1 and 2, exhibit low specific resistance and, after light sintering, a high density, compared to the cases of the ink compositions of Comparative Examples 1 and 2.

Third Example

An ink composition for light sintering according to a third example includes pure copper particles and copper oxide nanoparticles having copper oxide films and may further include a reducing agent for reducing copper oxidized by light irradiation to form copper nanoparticles, a dispersing agent, a binder, and a solvent.

Figure 13:
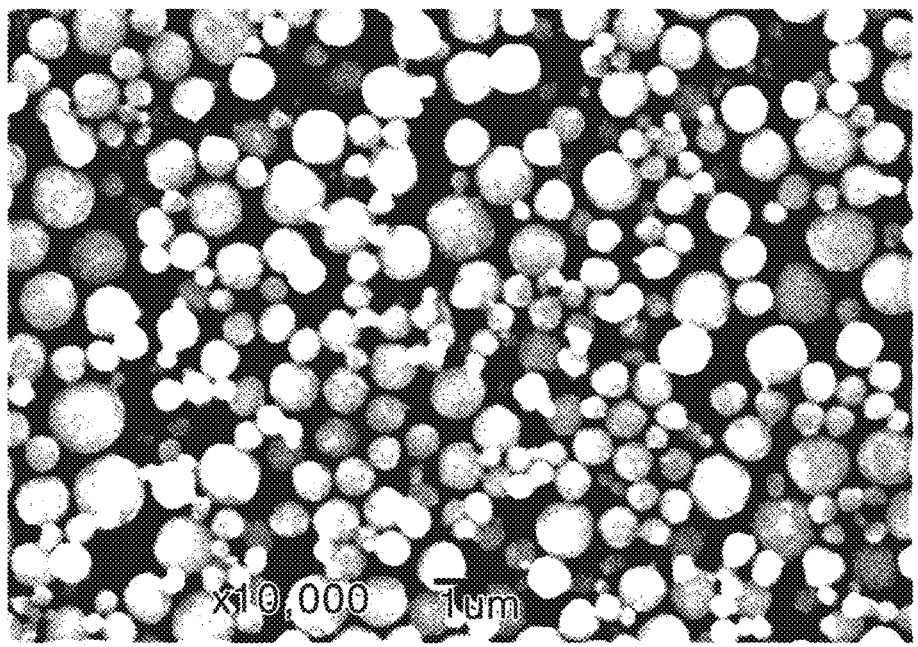
FIG. 13 is an SEM image illustrating pure copper particles included in an ink composition for light sintering according to a third example of the present invention.

The pure copper particles may be spherical particles having a size ($D_{50}$) of 2 μm or less or plate-shaped particles having a size ($D_{50}$) 4 μm or less. When the pure copper particles are plate-shaped particles, the pure copper particles may have a flake or multi-angle plate shape. For example, FIG. 13 illustrates an SEM image of pure copper particles having a $D_{50}$ of 880 nm.

The pure copper particles have an oxidation resistant film on the exteriors thereof to prevent oxidation. As the oxidation resistant film, fatty acid, such as steric acid, may be used. The oxidation resistant film may be formed to a thickness of several nanometers on the exteriors of the pure copper particles. The oxidation resistant film may be removed in a light sintering process.

Figure 14:
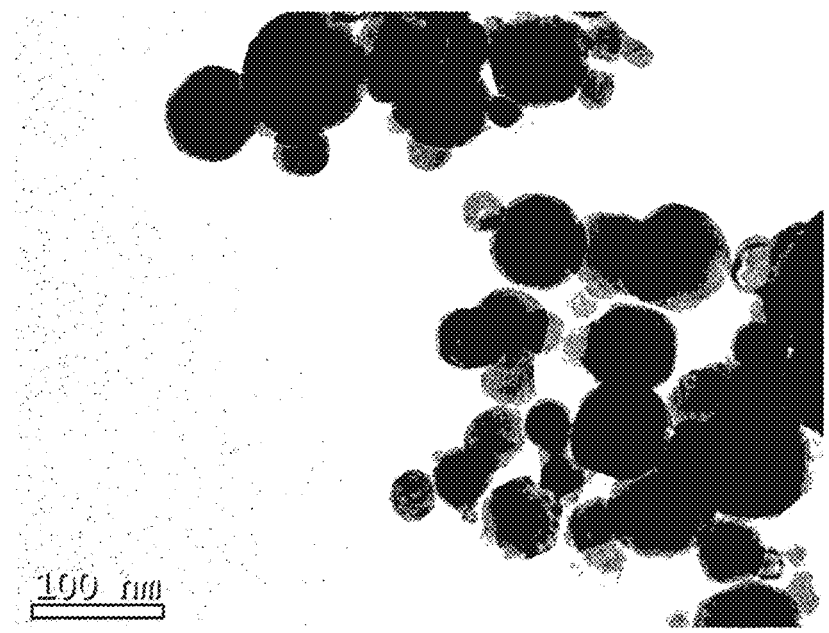
FIG. 14 is SEM and HRTEM images illustrating copper oxide nanoparticles included in an ink composition for light sintering according to a third example of the present invention.
Figure 14:
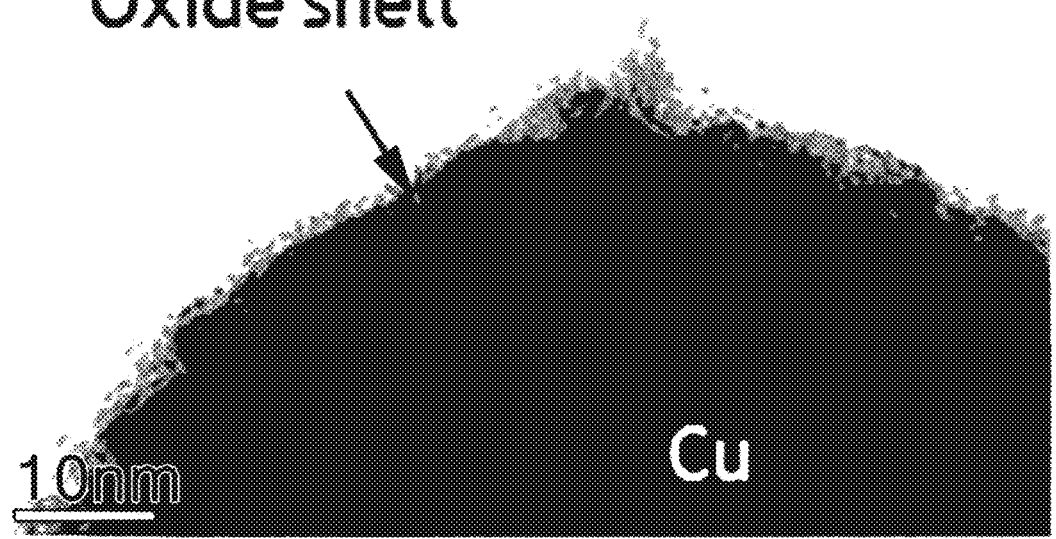

Although copper oxide nanoparticles are nonconductors, the copper oxide nanoparticles are converted into pure copper nanoparticles having electrical conductivity by light irradiation (sintering), thus being used as a source of a conductor. The copper oxide nanoparticles are core-shell type particles and a copper oxide film may be formed to a thickness of 50 nm or less on surfaces thereof. With regard to this, when the copper oxide film is coated to a thickness of greater than 50 nm, a portion of the copper oxide film might not be reduced into copper by light irradiation. Accordingly, the copper oxide nanoparticles are coated to a thickness of 50 nm or less with a copper oxide film. The copper oxide nanoparticles may have a $D_{50}$ of 900 nm or less and a $D_{max}$ of 2 μm or less. For example, FIG. 14 illustrates SEM and HRTEM images of copper oxide nanoparticles having a $D_{50}$ of 70 nm. FIG. 14 (a) illustrates the SEM image and FIG. 14 (b) illustrates the HRTEM image.

A fineness number of each of the pure copper particles and the copper oxide nanoparticles may be selectively adjusted according to application fields. For example, upon fabrication of a metal mesh, as a substituent of an ITO transparent electrode, for touchscreens, wire should be fabricated to a width of 1 μm or less to address visibility problems, such as moire and starburst phenomena. In this case, the size of particles is preferably adjusted to 300 nm or less.

Meanwhile, in the case of a double-sided FPCB digitizer requiring a wire width of 75 μm or less, the wire width might not be 300 nm or less, and maximum-size particles may be used in a range in which light sintering is possible.

A composition ratio of the pure copper particles:copper oxide nanoparticles may be 9:1 to 1:9. With regard to the composition ratio of the pure copper particles to the copper oxide nanoparticles, when a wiring pattern is formed using an ink composition for light sintering including 90% by weight of the pure copper particles, the compactness of a wiring pattern may be increased, but high light reflection occurs due to the pure copper particles upon light sintering, whereby light sintering efficiency may be decreased. In addition, upon irradiation with excessive optical energy, a wiring board may be damaged. When the content of the pure copper particles is less than 10% by weight, compactness increase of a wiring pattern might not be achieved.

When a reducing agent is irradiated with light, the reducing agent copper oxide reduces films of copper oxide nanoparticles into copper. That is, the reducing agent converts copper oxide nanoparticles into pure copper nanoparticles. As the reducing agent, an aldehyde-based compound, an acid including ascorbic acid, a phosphorous compound, a metallic reducing agent, p-benzoquinone, hydroquinone, or anthraquinone may be used.

For example, the aldehyde-based compound used as a reducing agent may be formaldehyde, acetaldehyde, or the like.

The acid used as a reducing agent may be oxalic acid, formic acid, ascorbic acid, sulfonic acid, dodecyl benzene sulfonic acid, maleic acid, hexamic acid, phosphoric acid, O-phthalic acid, acrylic acid, or the like.

The phosphorous compound used as a reducing agent may be a phosphite, a hypophosphite, phosphorous acid, or the like. In particular, the phosphorous compound used as a reducing agent may be a phosphorous compound including an unsaturated group, for example, a hydrogenphosphonate (acid phosphite) including an $HP(O)_2OH^-$ group (such as $NH_4HP(O)_2OH$ including a $PO_3^{3-}$ group), a diphosphite including $H_2P_2O_5^{2-}$, a phosphite including $HPO_3^{2-}$, such as $(NH_4)_2HPO_3.H_2O$, $CuHPO_3.H_2O$, $SnHPO_3$, or $Al_2(HPO_3)_3.4H_2O$, phosphite ester such as $(RO)_3P$, an organophosphorus compound, such as hypophosphite $(H_2PO_2^-)$, phosphatidylcholine, triphenylphosphate, cyclophosphamide, parathion, sarin(phosphinate), glyphosate (phosphonate), fosfomycin(phosphonate), zoledronic acid (phosphonate), or glufosinate(phosphinate), organic phosphine($PR_3$) such as triphenylphosphine, phosphine oxide($OPR_3$) such as triphenylphosphine oxide, phosphonite $(P(OR)R_2)$ such as $(CH_3O)_2PPh$, phosphonite($P(OR)_2R$), phosphinate($OP(OR)R_2$), organic phosphonates $(OP(OR)_2R)$, phosphate($PO_4^{3-}$), organophosphate $(OP(OR)_3)$, such as parathion, malathion, methyl parathion, chlorpyrifos, diazinon, dichlorvos, phosmet, fenitrothion, tetrachlorvinphos, azamethiphos, or azinphosmethyl, or the like.

The metallic reducing agent may be lithium aluminum hydride ($LiAlH_4$), diisobutylaluminum hydride (DIBAL-H), a Lindlar catalyst, or the like.

By including the reducing agent as a catalyst of the ink composition for light sintering, sintering may be performed by light irradiation, whereby damage such as warpage or shrinkage of the wiring board may be inhibited, a process time may be reduced compared to laser etching, thermal sintering, etc., and process costs may be reduced.

In the ink composition for light sintering according to the third example, the reducing agent is preferably included in an amount of 0.1 to 5 parts by weight based on 100 parts by weight of the pure copper particles and the copper oxide nanoparticles. Here, when an addition amount of the reducing agent is greater than 5 parts by weight, dispersibility and compatibility of the ink composition for light sintering are reduced and thus homogeneity may be reduced. On the other hand, when an addition amount of the reducing agent is less than 0.1 parts by weight, reduction and sintering of the copper oxide nanoparticles might not be smoothly performed by unicolor light irradiation.

The dispersing agent uniformly disperses the pure copper particles and the copper oxide nanoparticles in the ink composition for light sintering, thereby preventing the generation of pores in a wiring pattern formed by light sintering. As the dispersing agent, a cationic dispersing agent, an anionic dispersing agent, or an amphoteric ion-based dispersing agent may be used.

For example, the dispersing agent may be, without being limited to, an amine-based polymeric dispersing agent, such as polyethyleneimine or polyvinylpyrrolidone, a hydrocarbon-based polymeric dispersing agent having a carboxylic acid group, such as polyacrylic acid or carboxymethylcellulose, or a polymeric dispersing agent having a polar group, such as polyvinyl alcohol foam, a styrene-maleic acid copolymer, an olefin-maleic acid copolymer, a copolymer having polyethyleneimine and polyethyleneoxide parts in one molecule, or the like.

The binder, which serves to bind copper oxide nanoparticles when a wiring pattern is formed using the ink composition for light sintering, enables the wiring pattern to maintain superior printability and a high aspect ratio.

The binder may be, without being limited to, PVP, PVA, PVC, a cellulose-based resin, a polyvinyl chloride-based resin, a copolymerized resin, a polyvinyl alcohol-based resin, a polyvinyl pyrrolidone-based resin, an acrylic resin, a vinyl acetate-acrylic ester copolymer resin, a butyral resin, an alkyd resin, an epoxy resin, a phenolic resin, a rosin ester resin, a polyester resin, or silicone.

For example, the binder may be a mixed resin of epoxy acrylate, polyvinyl acetal, and phenolic resin. By using the mixed resin as a binder, heat curing may be performed at a temperature of about 150° C. (a three-dimensional reticular structure may be formed and thus a very thermally stable structure may be formed) and thus heat resistance of the ink composition for light sintering may be increased.

In addition, the ink composition for light sintering according to the third example has a heat resistance of 280° C. or more and thus may be subjected to soldering. Accordingly, the ink composition may be soldered with a passive element, an active element, other circuit lines, etc. and thus may be electrically connected thereto. When heat resistance of the ink composition is not satisfied, resistance increases and mechanical properties are decreased at a contact or a junction, whereby defects may occur. When resistance increases, signal transmission may be delayed or various problems may occur throughout a device.

In addition, a mix ratio of epoxy acrylate, polyvinyl acetal, and a phenolic resin included in the binder is preferably 1:0.1-1:0.1-5.

An addition amount of the binder is preferably 3 to 10 parts by weight based on 100 parts by weight of the pure copper particles and the copper oxide nanoparticles. When the content of the binder is greater than 10 parts by weight, excessive increase of resistance ingredients between particles is induced and thus electrical resistance increases. When the content of the binder is less than 3 parts by weight, it is difficult to cover all particle surfaces, rheological instability is exhibited, and adhesion to a wiring board is decreased.

In addition, the solvent may be, without being limited to, a hydrocarbon-based solvent, a chlorinated hydrocarbon-based solvent, a cyclic ether-based solvent, a ketone-based solvent, an alcohol, a polyhydric alcohol-based solvent, an acetate-based solvent, an ether-based solvent or terpene-based solvent, as a polyhydric alcohol, or the like. For example, the solvent may include ethylene glycol (EG), diethylene glycol (DEG), dibasic ester (DBE), carbitol acetate (CA), dipropylene glycol methyl ether (DPM or DPGME), butyl carbitol acetate (BCA), butyl carbitol (BC), Texanol, terpineol, or butyl acrylate (BA).

In the ink composition for light sintering according to the third example, the content of the pure copper particles and the copper oxide nanoparticles, except for a solvent, is preferably 70 to 94% by weight. With regard to this, when the content of the pure copper particles and the copper oxide nanoparticles is less than 70% by weight, it is difficult to transfer current heat to all particles by light irradiation, and thus, it is difficult to fabricate a dense wiring pattern. On the other hand, when the content of the pure copper particles and the copper oxide nanoparticles is greater than 94% by weight, the content of the particles (the pure copper particles and the copper oxide nanoparticles) is excessive and thus the viscosity thereof is not suitable for forming a wiring pattern. In addition, the content of the reducing agent is low with respect to the content of the particles, and thus, excessive light energy is required to perform light sintering. When the wiring board excessive is irradiated with excessive light energy, the wiring board may be damaged.

Meanwhile, the ink composition for light sintering according to the third example may additionally, selectively include an amine-based antioxidant, a thixotropic adjuster, leveling agent, a silane coupling agent for strengthening adhesion, or the like according to a use environment.

The ink composition for light sintering according to the third example may be used in all of a synthetic resin board selected from polyimide, polyurethane, PMMA, and PET, a metallic board selected from stainless, aluminum, gold, and silver, or an indium tin oxide (ITO), a nonmetallic board selected from ceramic, glass, and silicone, and the like. The ink composition may increase adhesion of a wiring pattern to these boards, may increase printability of the wiring pattern, and allows realization of a high aspect ratio. In particular, the ink composition for light sintering according to the third example may be used to fabricate a wiring pattern of a thin, heat-vulnerable, and flexible wiring board.

A wiring pattern may be formed by a screen printing, as a printing method, using the ink composition for light sintering according to the third example. However, the printing method may also be gravure printing, offset printing, flexo printing, aerosol-jet printing, slit die coating, barcoating, or the like. The ink composition for light sintering according to the third example may be applied to various printing method by changing the viscosity thereof, a solvent type, etc.

An apparatus for fabricating a wiring board using the ink composition for light sintering according to the third example is the same as that illustrated in FIG. 1, except that the ink composition for light sintering according to the second example, instead of the ink composition for light sintering according to the first example, is used as an ink composition.

The third example uses white light generated from a xenon flash lamp, as a unicolor pulse light, because pulse width, pulse gap, a pulse number, and intensity may be precisely adjusted.

A unicolor pulse light used to fabricate a flexible printed circuit board may be white light having a pulse width of 100 μs to 1000 μs, a pulse gap of 0.01 ms to 1 ms, an output voltage of 100 to 500 V, a pulse number of 1 to 10, and an intensity of 3 J/cm$^2$ to 60 J/cm$^2$. For example, when the thickness of a preliminary wiring pattern is less than 9 μm, unicolor pulse light may have a pulse number of 1, and, when the thickness of a preliminary wiring pattern is 9 μm or more, unicolor pulse light may have a pulse number of 2 or more.

Here, when the white light has a pulse width of greater than 5000 μs, incident energy is reduced per unit time and thus light sintering efficiency may be decreased.

When the pulse gap is greater than 1 ms or the pulse number is greater than 10, energy of white light is low and thus an ink composition for light sintering might not be satisfactorily sintered.

In addition, when the pulse gap is smaller than 0.01 ms or the intensity of the white light is greater than 60 J/cm$^2$, a lamp may be damaged or the lifespan of the lamp may be shortened and the flexible printed circuit board may be damaged.

In addition, when the intensity of the white light is 3 J/cm$^2$ or less, reaction reducing the copper oxide films of the copper oxide nanoparticles to copper is weak and thus electric resistance characteristics of the wiring pattern may be deteriorated.

On the other hand, when the intensity of the white light is greater than 60 J/cm$^2$, high energy is provided to the flexible printed circuit board and thus the board body may exhibit damages such as shrinkage, warpage, distortion, etc. In addition, the wiring pattern may be exfoliated from the board body.

As such, since the ink composition for light sintering according to the third example includes the pure copper particles and the copper oxide nanoparticles, a wiring pattern which is denser and has superior conductivity may be formed. In addition, since the ink composition for light sintering according to the second example is smoothly light-sintered under low light irradiation energy, production coats of a wiring board may be reduced.

Figure 15:
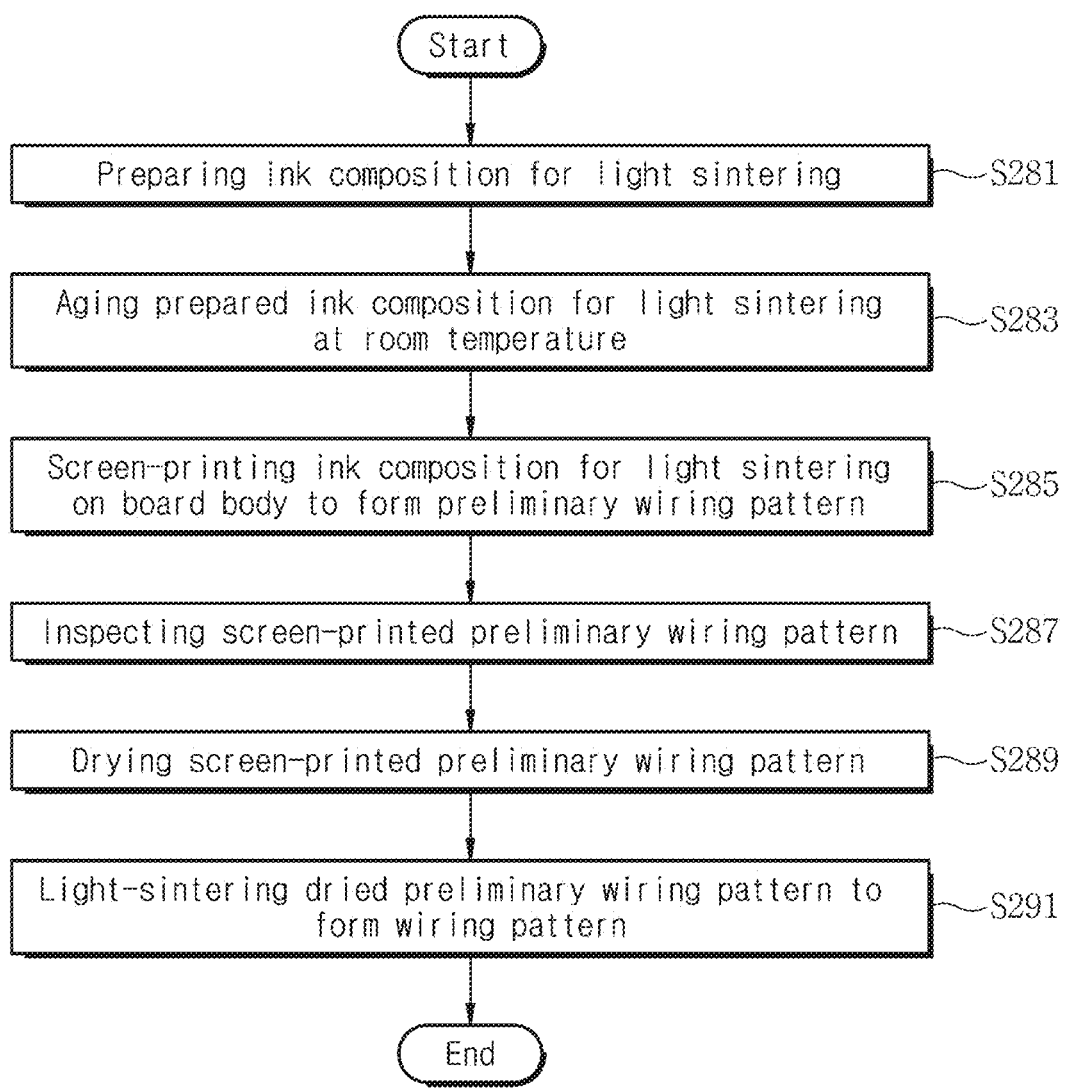
FIG. 15 illustrates a flowchart of a method of fabricating a wiring board using an ink composition for light sintering according to the third example of the present invention.

A method of fabricating the wiring board according to the third example is described below with reference to FIGS. 1, 3 to 7, and 15. Here, FIG. 15 is a flowchart illustrating a method of fabricating a wiring board using an ink composition for light sintering according to the third example of the present invention.

First, in S281, an ink composition for light sintering is prepared. That is, the ink composition for light sintering is prepared by mixing pure copper particles, copper oxide nanoparticles, a reducing agent, a dispersing agent, a binder, and a solvent. Here, the ingredients composing the ink composition for light sintering are primarily pre-dispersed for 30 minutes to several hours by means of a pre-disperser. The pre-dispersed ink composition for light sintering is secondarily highly-dispersed by means of a 3-roll mill, whereby the ingredients composing the ink composition for light sintering may be uniformly mixed. In addition, an ink composition for light sintering to form a preliminary wiring pattern may be finally prepared by filtering foreign substances and aggregates from the mixed ink composition for light sintering.

Subsequently, in S283, the prepared ink composition for light sintering is aged at room temperature. That is, the ink composition for light sintering prepared in S281 is aged at room temperature for several hours. The aged ink composition for light sintering is provided to the screen-printing part 20.

Subsequently, as illustrated in FIG. 3, the board body 71 is supplied to the screen-printing part 20 via the wiring board supply part 10. Here, the board body 71 may be a half-finished wiring board wherein a wiring pattern is not formed on an upper surface of the board body 71 or a wiring pattern is formed on a lower surface of the board body 71.

Subsequently, in S285, the ink composition for light sintering 27 is screen-printed on the board body 71, thereby forming the preliminary wiring pattern 73, as illustrated in FIG. 4. That is, when the board body 71 is transferred on a stage, the ink composition for light sintering 27 is injected onto the screen 21 loaded on the board body 71 by means of the squeezer 25 such that the hole pattern 23 is filled with the ink composition for light sintering 27. In addition, by separating the screen 21 from the board body 71, a preliminary wiring pattern 73 may be formed on the board body 71.

For example, the preliminary wiring pattern 73 may be screen-printed on the board body 71 to a wire width of 30 to 300 μm and a thickness 5 to 20 μm. Here, when the thickness of the preliminary wiring pattern 73 is 5 μm or less, it is difficult to control a pulse of white light generated from a xenon flash lamp. Accordingly, the shape of the wiring pattern formed by the light sintering may be deformed or damaged. On the other hand, when the thickness of the preliminary wiring pattern 73 is greater than 20 μm, reduction and light sintering by light irradiation may be satisfactorily performed and thus resistance of the wiring pattern may increase. That is, such resistance increase occurs because a proportion of non-reduced copper oxide nanoparticles of the copper oxide nanoparticles forming the preliminary wiring pattern 73 increases proportionally to the thickness of the preliminary wiring pattern.

Subsequently, in S287, the screen-printed preliminary wiring pattern 73 is inspected. That is, the printing inspection part 30 inspects by means of a camera whether the preliminary wiring pattern 73 is satisfactorily printed on the board body 71.

Subsequently, in S289, the screen-printed preliminary wiring pattern 73 is dried as illustrated in FIG. 5. That is, the drying part 40 dries a solvent included in the preliminary wiring pattern 73 formed on the board body 71 which has been validated by the printing inspection process, thereby removing the solvent. For example, the drying part 40 provides 60 to 100° C. hot air or infrared light to the preliminary wiring pattern 73 to dry a solvent included in the preliminary wiring pattern 73, thus removing the solvent.

In addition, in S291, a wiring pattern 75 is formed by light-sintering the dried preliminary wiring pattern 73 and thus a wiring board 70 having the wiring pattern 75 formed thereon according to the third example may be fabricated, as illustrated in FIG. 6. That is, the light-sintering part 50 irradiates unicolor pulse light to the dried preliminary wiring pattern 73, and thus, oxidized copper of copper oxide nanoparticles included in the preliminary wiring pattern 73 is reduced and sintered, thereby forming the wiring pattern 75 on the board body 71. For example, the unicolor pulse light used to fabricate the flexible printed circuit board may be white light having a pulse width of 100 μs to 5000 μs, a pulse gap of 0.01 ms to 1 ms, an output voltage of 100 to 500 V, a pulse number of 1 to 10, and an intensity of 3 J/cm$^2$ to 60 J/cm$^2$.

Although the wiring board 70 fabricated by the method according to the third example includes the board body 71 and the wiring pattern 75 formed on an upper surface of the board body 71, the present invention is not limited to this embodiment. For example, the wiring board 70 may have a structure wherein the wiring pattern is formed on both surfaces of the board body 71. That is, when the board body 71, on a lower surface of which a lower-surface wiring pattern is formed, is provided by the wiring board supply part 10, a wiring board having a wiring pattern on both surfaces thereof may be fabricated by forming the upper-surface wiring pattern on an upper surface of the board body 71. Of course, the lower-surface wiring pattern may also be formed using the ink composition for light sintering according to the third example.

When the wiring pattern 75 of the wiring board 70 is formed using cheap copper oxide nanoparticles having a copper oxide film as a material of the ink composition according to the third example, production cost of the wiring board 70 may be reduced.

In addition, since, when the ink composition for light sintering 27 including pure copper particles and copper oxide nanoparticles is printed on the wiring board 70 and then sintered, copper oxide films formed on surfaces of the copper nanoparticles may be removed by a sintering process using short-wavelength light irradiation instead of thermal sintering, process time may be reduced and damaging of the wiring board 70 may be inhibited by the sintering process using short-wavelength light irradiation. Here, the copper oxide nanoparticles are in an insulation state before light sintering, but are reduced into pure copper nanoparticles by light sintering. Accordingly, the wiring pattern 75 composed of copper having electrical conductivity may be formed.

Accordingly, by applying the ink composition for light sintering according to the third example to a board body 71 of a flexible printed circuit board used in a digitizer, the wiring pattern 75 may be formed without damaging the board body 71.

In addition, when the wiring pattern 75 of the wiring board 70 is formed using the ink composition for light sintering including copper nanoparticles having copper oxide films, the wiring pattern 75 may be formed to have a high aspect ratio by screen-printing. That is, since a signal transmission speed of the wiring board 70 depends upon resistance, the wiring pattern 75 may be formed by screen-printing to have a high aspect ratio.

In addition, since the ink composition for light sintering according to the third example includes pure copper particles, compactness of a wiring pattern may be increased compared to the case in which copper oxide nanoparticles are used alone. That is, an ink composition including only copper oxide nanoparticles forms a wiring pattern in a shape wherein a plurality of pores are included in the interior of the wiring pattern due to gas generated upon light sintering. However, when pure cooper particles are included as in the third example, the amount of gas generated in a light sintering process is reduced and thus the amount of pores that may present in the interior of the wiring pattern may be reduced, thereby forming a wiring pattern having improved compactness.

Since the ink composition for light sintering according to the third example includes pure copper particles, light sintering efficiency may be increased compared to the case in which copper oxide nanoparticles are used alone. That is, upon light sintering of the ink composition including pure copper particles as in the third example, a light absorption rate is high and thus light sintering efficiency may be increased, compared to an ink composition including only copper oxide nanoparticles as copper particles.

Figure 16:
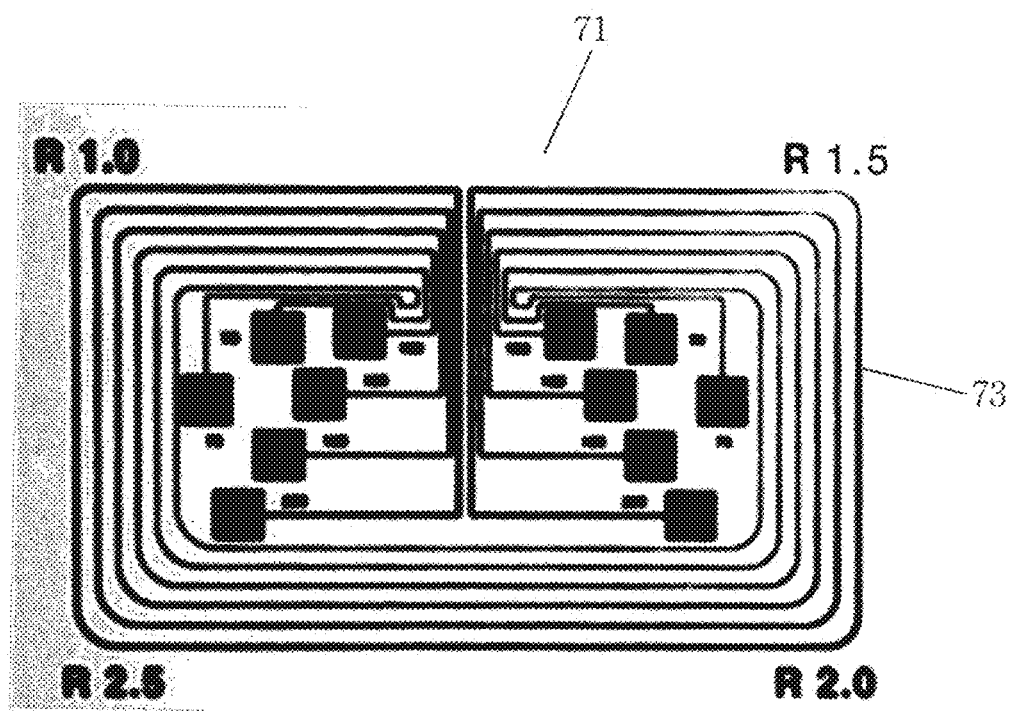
FIG. 16 is a photograph illustrating a preliminary wiring pattern before light sintering.
Figure 17:
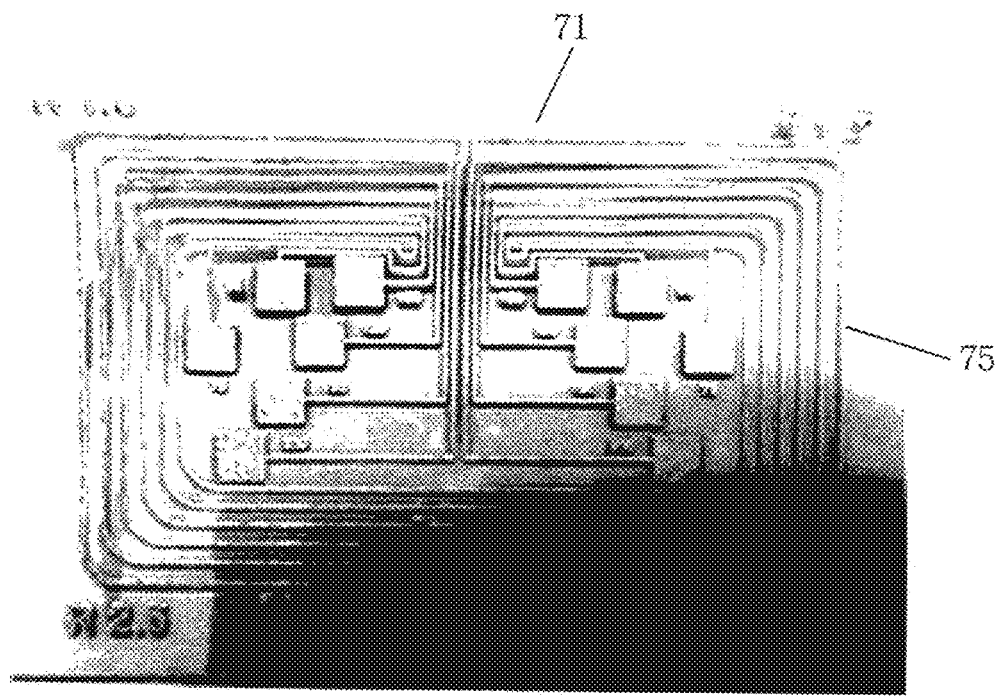
FIG. 17 is a photograph illustrating a wiring pattern after light sintering.
Figure 18:
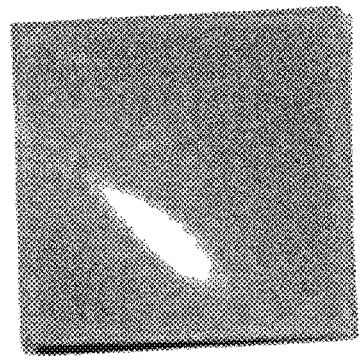
FIG. 18 is photographs illustrating patterns formed by screen-printing ink compositions according to an example and a comparative example and then light-sintering the same.
Figure 18:
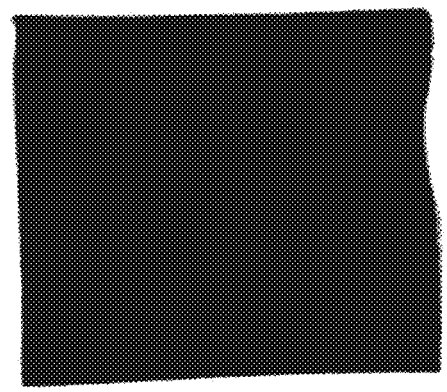
Figure 18:
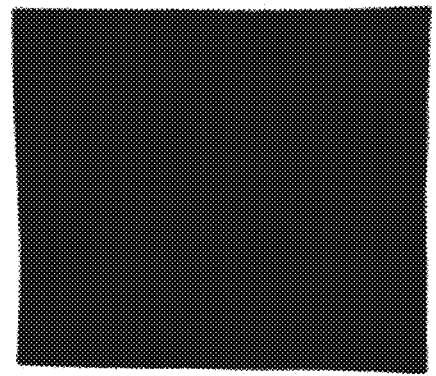
Figure 19:
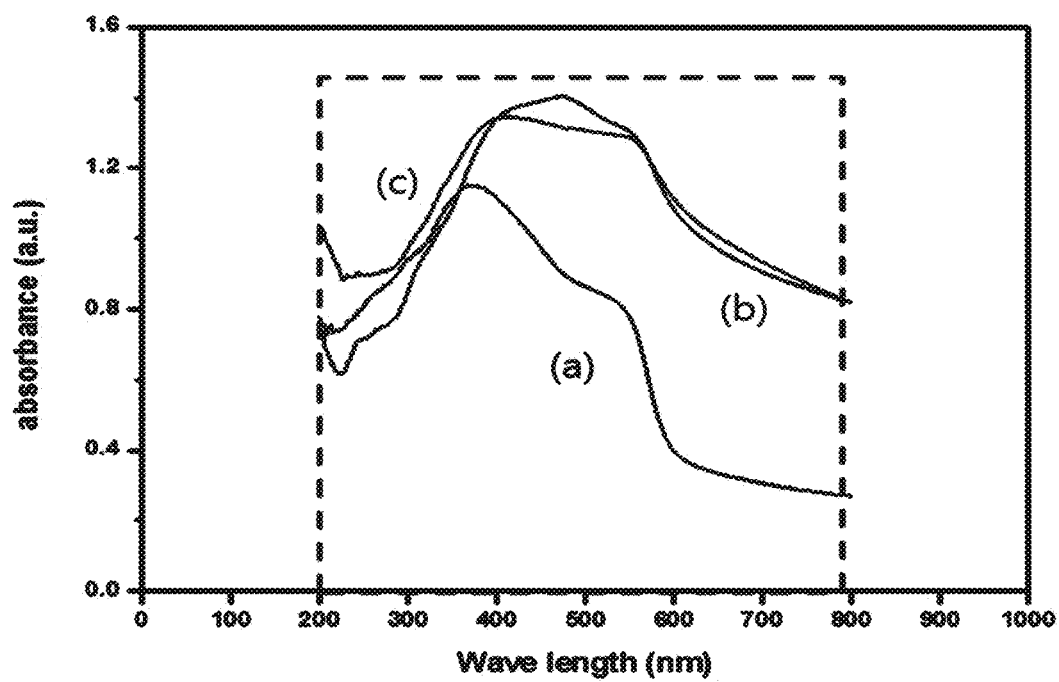
FIG. 19 illustrates graphs of light absorption spectra exhibited upon light sintering of ink compositions according to an example and a comparative example.

A wiring board 100 fabricated by the method according to the third example is described below with reference to FIGS. 16 to 19. Here, FIG. 16 is a photograph illustrating a preliminary wiring pattern before light sintering. FIG. 17 is a photograph illustrating a wiring pattern after light sintering. FIG. 18 is photographs illustrating patterns formed by screen-printing ink compositions according to an example and a comparative example and then light-sintering the same. FIG. 19 illustrates graphs of light absorption spectra exhibited upon light sintering of ink compositions according to an example and a comparative example.

Here, a wiring board was fabricated using an ink composition according to each of examples and comparative examples as summarized the following table.

TABLE 3

| Sample | Specific light energy (J/cm$^2$) | specific resistance (×10$^{-6}$ Ωcm) | Density before sintering (g/cm$^2$) | Density after sintering (g/cm$^2$) |
|---|---|---|---|---|
| Example 1 | 11 | 2.5 | 3.8 | 8.7 |
| Example 2 | 10.5 | 3.5 | 3.9 | 8.4 |
| Comparative Example 1 | 11 | 6.9 | 3.6 | 7.2 |

Table 3 shows light irradiation energy and specific resistance upon light sintering according to examples and comparative examples. As a light sintering apparatus for light irradiation, Pulse forge 1300 available from Novacentrics was used and specific resistance was measured by means of a 4-pin probe of LORESTA-GP.

Example 1

An ink composition for light sintering including 84% by weight of metallic particles in which pure copper particles having a flake shape and a $D_{50}$ of 2.5 μm and copper oxide nanoparticles, which were coated to a thickness of about 30 nm with a copper oxide film and had a $D_{50}$ of 100 nm, are mixed, was prepared. Here, a composition ratio of the pure copper particles to the copper oxide nanoparticles is 7:3.

A 3×3 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 3.

In addition, to calculate the density of a printed electrode after drying, the weight of the printed electrode was weighed and the thickness of the electrode was measured by means of a confocal microscope.

As a result, the density was determined to be about 3.8 g/cm$^3$. After light sintering, the density increased to 8.7 g/cm$^3$ and a specific resistance was 2.5×10$^{-6}$ Ωcm.

Example 2

An ink composition for light sintering including 84% by weight of metallic particles in which pure copper particles having a flake shape and a $D_{50}$ of 2.5 μm and copper oxide nanoparticles, which were coated to a thickness of about 30 nm with a copper oxide film and had a $D_{50}$ of 100 nm, are mixed, was prepared. Here, a composition ratio of the pure copper particles to the copper oxide nanoparticles is 3:7. A 3×3 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 3.

In addition, to calculate the density of a printed electrode after drying, the weight of the printed electrode was weighed and the thickness of the electrode was measured by means of a confocal microscope.

As a result, the density was determined to be about 3.9 g/cm$^3$. After light sintering, the density increased to 8.4 g/cm$^3$ and a specific resistance was 3.5×10$^{-6}$ Ωcm.

Comparative Example 1

An ink composition including 84% by weight of metallic particles that were merely composed of copper oxide nanoparticles coated to a thickness of about 30 nm with a copper oxide film and having a $D_{50}$ of 100 nm was prepared.

A 3×3 cm$^2$ square pattern was printed by screen printing (Sus 400 mesh, emulsion thickness: 8 μm, stretching angle: 45°) and drying was performed at 100° C. for 30 minutes, followed by light sintering under conditions summarized in Table 3.

In addition, to calculate the density of a printed electrode after drying, the weight of the printed electrode was measured and the thickness of the electrode was measured by means of a confocal microscope.

As a result, the density was determined to be about 3.6 g/cm$^3$. After light sintering, the density increased to 7.2 g/cm$^3$ and a specific resistance was 6.9×10$^{-6}$ Ωcm.

Comparative Example 2

An ink composition including 84% by weight of metallic particles that were merely composed of pure copper particles having a flake shape and a $D_{50}$ of 2.5 μm was prepared.

A 3×3 cm$^2$ square pattern was printed by screen printing (Sus 400 mesh, emulsion thickness: 8 μm, stretching angle:

45°) and drying was performed at 100° C. for 30 minutes, followed by light sintering under conditions summarized in Table 3.

As such, it can be confirmed that the patterns formed using the ink compositions for light sintering according to Examples 1 and 2, exhibit low specific resistance and, after light sintering, a high density, compared to the case of the ink composition of Comparative Example 1.

Meanwhile, an optical absorption rate of the pattern formed on the board body of the sample of each of Example 1 and Comparative Examples 1 and 2 was measured by means of a UV-vis spectrometer. FIG. 18 illustrates the samples. FIG. 18(a) illustrates a photograph of the sample of Comparative Example 2, FIG. 18(b) illustrates a photograph of the sample of Comparative Example 1, and FIG. 18(c) illustrates a photograph of the sample of Example 1. As a UV-vis spectrometer, V-670 available from JASCO was used. Here, a measurement range was 800 nm to 200 nm, a measurement speed was 400 nm/min, and a band width was 1 nm.

Measurement results of the optical absorption rates are illustrated in FIG. 19. In FIG. 19, (a) is graph illustrating a light absorption spectrum of Comparative Example 2, (b) is graph illustrating a light absorption spectrum of Comparative Example 1, and (c) is graph illustrating a light absorption spectrum of Example 1.

Referring to FIG. 19, it can be confirmed that the ink composition for light sintering including both pure copper particles and copper oxide nanoparticles exhibits a high light absorption rate, compared to the ink composition including only one of pure copper particles and copper oxide nanoparticles. That is, it can be confirmed that the ink composition for light sintering of Example 1 exhibits a high light absorption rate in a visible light range, compared to the ink composition including only copper oxide nanoparticles.

As such, the ink composition for light sintering according to Example 1 has a superior light absorption rate and thus may increase light sintering efficiency. Accordingly, light sintering may be smoothly performed even given low light irradiation energy.

Meanwhile, embodiments of the present invention disclosed in the present specification and drawings are only provided to help understanding of the present invention and the present invention is not limited to the embodiments. It will be apparent to those skilled in the art that various modifications can be made to the above-described exemplary embodiments of the present invention without departing from the spirit or scope of the invention.

What is claimed is:

1. A method of fabricating a wiring board using an ink composition for light sintering, the method comprising:
    forming a preliminary wiring pattern by screen-printing an ink composition for light sintering comprising (i) a reducing agent for reducing copper oxidized by light irradiation to form copper nanoparticles, (ii) copper oxide nanoparticles having copper oxide films on surfaces of the copper nanoparticles, (iii) a dispersing agent, (iv) a binder, (v) a solvent, and (vi) silver oxide on a flexible board body, wherein the silver oxide and the copper oxide nanoparticles, except for the solvent, are comprised in an amount of 70% to 94% by weight;
    drying the screen-printed preliminary wiring pattern; and
    forming a wiring pattern on the board body by irradiating the dried preliminary wiring pattern with light and thus reducing and sintering the oxidized copper of the copper oxide nanoparticles comprised in the preliminary wiring pattern, and
    wherein the binder is a mixed resin including epoxy acrylate, polyvinyl acetal, and phenolic resin.

2. The method according to claim 1, further comprising:
    before forming the preliminary wiring pattern, preparing an ink composition for light sintering by mixing (i) a reducing agent for reducing copper oxidized by light irradiation to form copper nanoparticles, (ii) copper oxide nanoparticles having copper oxide films on surfaces of the copper nanoparticles, (iii) a dispersing agent, (iv) a binder, (v) a solvent, and (vi) silver oxide; and
    aging a prepared ink composition for light sintering at room temperature.

3. The method according to claim 1, wherein, in forming the preliminary wiring pattern, the preliminary wiring pattern is screen-printed on the board body so as to have a wire width of 50 to 100 μm and a thickness of 5 to 10 μm.

4. The method according to claim 1, wherein, the solvent comprised in the preliminary wiring pattern is removed by applying 60 to 100° C. hot air or infrared light to the preliminary wiring pattern.

5. The method according to claim 1, wherein, the reducing and the sintering are performed by irradiating unicolor pulse light to the preliminary wiring pattern.

6. The method according to claim 5, wherein the unicolor pulse light is white light having a pulse width of 100 μs to 1000 μs, a pulse gap of 0.01 ms to 1 ms, an output voltage of 100 to 400 V, a pulse number of 1 to 10, and an intensity of 5 J/cm2 to 20 J/cm2.

7. The method according to claim 6, wherein the unicolor pulse light is white light generated from a xenon flash lamp.

8. The method according to claim 6, wherein, in the light sintering, a pulse number of the unicolor pulse light is 1 when a thickness of the preliminary wiring pattern is less than 9 μm and a pulse number of the unicolor pulse light is 2 or more when the thickness of the preliminary wiring pattern is 9 μm or more.

9. The method according to claim 1, wherein the ink composition for light sintering further comprises pure copper particles, on exteriors of which an oxidation resistant film is formed.

10. The method according to claim 9, further comprising:
    before forming a preliminary wiring pattern, preparing an ink composition for light sintering by mixing pure copper particles, copper oxide nanoparticles, a reducing agent, a dispersing agent, a binder, and a solvent; and
    aging a prepared ink composition for light sintering at room temperature.

11. The method according to claim 9, wherein, in forming the preliminary wiring pattern, the preliminary wiring pattern is screen-printed on the board body so as to have a wire width of 30 to 300 μm and a thickness of 5 to 20 μm.

12. The method according to claim 9, wherein, the solvent comprised in the preliminary wiring pattern is removed by applying 60 to 100° C. hot air or infrared light to the preliminary wiring pattern.

13. The method according to claim 9, wherein, the reducing and the sintering are performed by irradiating unicolor pulse light to the preliminary wiring pattern, wherein the unicolor pulse light is white light having a pulse width of 100 μs to 5000 μs, an output voltage of 100 to 500 V, a pulse number of 1 to 10, and an intensity of 3 J/cm2 to 60 J/cm2.

14. The method according to claim 13, wherein, a pulse number of the unicolor pulse light is 1 when a thickness of the preliminary wiring pattern is less than 9 μm, and a pulse number of the unicolor pulse light is 2 or more when a thickness of the preliminary wiring pattern is 9 μm or more.

15. The method according to claim 1, wherein the reducing agent comprises a phosphorus compound, a metallic reducing agent, p-benzoquinone, hydroquinone, or anthraquinone.

* * * * *